(12) United States Patent
Jung et al.

(10) Patent No.: US 9,875,918 B2
(45) Date of Patent: Jan. 23, 2018

(54) INITIATOR AND METHOD FOR DEBONDING WAFER SUPPORTING SYSTEM

(71) Applicant: Samsung Electronics Co., Ltd., Suwon-si, Gyeonggi-do (KR)

(72) Inventors: Kyu-Dong Jung, Suwon-si (KR); Jung-Hwan Kim, Bucheon-si (KR); Dong-Gil Lee, Seoul (KR); Tae-Je Cho, Yongin-si (KR); Kwang-Chul Choi, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 106 days.

(21) Appl. No.: 14/788,783

(22) Filed: Jun. 30, 2015

(65) Prior Publication Data

US 2016/0093518 A1 Mar. 31, 2016

(30) Foreign Application Priority Data

Sep. 29, 2014 (KR) ........................ 10-2014-0130461

(51) Int. Cl.
*B32B 43/00* (2006.01)
*H01L 21/67* (2006.01)
(Continued)

(52) U.S. Cl.
CPC ........ *H01L 21/67115* (2013.01); *B32B 38/10* (2013.01); *B32B 41/00* (2013.01); *B32B 43/006* (2013.01); *H01L 21/67092* (2013.01); *H01L 21/67253* (2013.01); *B32B 2250/02* (2013.01); *B32B 2310/0843* (2013.01);
(Continued)

(58) Field of Classification Search
CPC . H01L 2221/68381; H01L 2221/68386; H01L 2224/98; Y10S 156/93; Y10S 156/941; Y10T 156/1158; Y10T 156/1168; Y10T 156/1917; Y10T 156/1978; B32B 43/006
See application file for complete search history.

(56) References Cited

U.S. PATENT DOCUMENTS 5,447,596 A * 9/1995 Hayase ............... H01L 21/6835
156/701
6,418,999 B1 * 7/2002 Yanagita ................. B26F 3/004
156/756
(Continued)

FOREIGN PATENT DOCUMENTS

WO WO 2016112975 A1 * 7/2016 ................ C09J 5/00

*Primary Examiner* — Mark A Osele
(74) *Attorney, Agent, or Firm* — Renaissance IP Law Group LLP

(57) ABSTRACT

Provided are an initiator and a method for debonding a wafer supporting system. The initiator for debonding a wafer supporting system includes a rotation chuck having an upper surface on which a wafer supporting system (WSS), which includes a carrier wafer, a device wafer, and a glue layer for bonding the carrier wafer and the device wafer to each other, is seated to rotate the wafer supporting system, a detecting module detecting a height and a thickness of the glue layer and a laser module generating a fracture portion on the glue layer through irradiating a side surface of the glue layer with a laser on the basis of the height and the thickness of the glue layer.

19 Claims, 24 Drawing Sheets

(51) Int. Cl.
  *B32B 38/10*   (2006.01)
  *B32B 41/00*   (2006.01)

(52) U.S. Cl.
  CPC . *B32B 2457/14* (2013.01); *H01L 2221/68381* (2013.01); *H01L 2224/98* (2013.01); *Y10T 156/1158* (2015.01); *Y10T 156/1917* (2015.01)

(56) References Cited

U.S. PATENT DOCUMENTS

| | | | |
|---|---|---|---|
| 6,436,226 B1 * | 8/2002 | Omi | B26F 3/004 |
| | | | 156/239 |
| 6,554,949 B2 | 4/2003 | De et al. | |
| 6,672,358 B2 * | 1/2004 | Yanagita | H01L 21/67092 |
| | | | 156/750 |
| 7,651,878 B2 | 1/2010 | Ryu | |
| 7,989,266 B2 | 8/2011 | Borthakur et al. | |
| 8,002,899 B2 | 8/2011 | Wu et al. | |
| 8,083,115 B2 * | 12/2011 | Rayssac | B28D 5/0011 |
| | | | 156/254 |
| 8,343,300 B2 | 1/2013 | Hermanowski | |
| 8,366,873 B2 | 2/2013 | George | |
| 8,410,394 B2 * | 4/2013 | Millman, Jr. | B23K 26/0676 |
| | | | 219/121.67 |
| 8,551,291 B2 | 10/2013 | George | |
| 8,574,398 B2 | 11/2013 | George | |
| 9,368,376 B2 * | 6/2016 | Yu | H01L 21/67092 |
| 2008/0302481 A1 | 12/2008 | Berger et al. | |
| 2011/0297329 A1 | 12/2011 | Canale et al. | |
| 2012/0080150 A1 | 4/2012 | Riege et al. | |
| 2013/0032296 A1 | 2/2013 | Zhong | |
| 2013/0084459 A1 * | 4/2013 | Larson | C09J 4/00 |
| | | | 428/422 |
| 2013/0323907 A1 | 12/2013 | Oosterhus et al. | |
| 2014/0103499 A1 | 4/2014 | Andry et al. | |
| 2014/0106473 A1 | 4/2014 | Andry et al. | |
| 2014/0130962 A1 | 5/2014 | Yu et al. | |
| 2014/0130969 A1 | 5/2014 | McCutcheon et al. | |
| 2014/0134796 A1 | 5/2014 | Kelly et al. | |
| 2014/0144593 A1 | 5/2014 | Dang et al. | |
| 2016/0204015 A1 * | 7/2016 | Allen | H01L 25/03 |
| | | | 438/667 |

* cited by examiner

INITIATOR AND METHOD FOR DEBONDING WAFER SUPPORTING SYSTEM

CROSS-REFERENCE TO RELATED APPLICATIONS

This application claims priority from Korean Patent Application No 10-2014-0130461, filed on Sep. 29, 2014, in the Korean Intellectual Property Office, the disclosure of which is incorporated herein in its entirety by reference.

BACKGROUND

1. Field

Example embodiments relate to an initiator and a method for debonding a wafer supporting system.

2. Related Art

In the case of a conventional semiconductor device, a package is fabricated by a wire bonding method or flipchip bonding method. Such a wire bonding method or flipchip bonding method has been evaluated as a good technology that can achieve high safety and high yield in the case where the semiconductor device has a low degree of integrity.

However, as the integrity of a semiconductor device and the performance of peripheral devices become higher, a technology has been developed to stack chips rather than to enumerate the chips in parallel. In this case, if a wire bonding method is used, processes become complicated.

Accordingly, a through silicon via (TSV), which has a simple configuration and includes an abruptly shortened transmission path, has been developed. Since the through silicon via has a very short distance in which respective chips and a substrate are connected to each other, the speed of a package can be greatly improved, and a signal loss can be greatly reduced.

In order to form such a through silicon via, a wafer supporting system (WSS) that heightens durability of a wafer may be used.

SUMMARY

Some example embodiments provide an initiator for debonding a wafer supporting system, which can achieve small loss of a wafer and high debonding efficiency.

Other example embodiments provide a method for debonding a wafer supporting system, which can achieve small loss of a wafer and high debonding efficiency.

According to some example embodiments, there is provided an initiator for debonding a wafer supporting system, comprising a rotation chuck having an upper surface on which a wafer supporting system (WSS), which includes a carrier wafer, a device wafer, and a glue layer for bonding the carrier wafer and the device wafer to each other. The initiator is seated to rotate the wafer supporting system, a detecting module detecting a height and a thickness of the glue layer and a laser module generating a fracture portion on the glue layer through irradiating a side surface of the glue layer with a laser on the basis of the height and the thickness of the glue layer.

A thickness of the carrier wafer is equal to or larger than a thickness of the device wafer.

The carrier wafer and the device wafer are in a circular shape, and a diameter of the carrier wafer is equal to or larger than a diameter of the device wafer.

In the wafer supporting system, the glue layer is formed on an upper surface of the carrier wafer, and the device wafer is bonded onto the glue layer.

A center of the carrier wafer and a center of the device wafer vertically overlap each other.

A center of the wafer supporting system and a rotating center of the rotation chuck are aligned to vertically overlap each other.

The initiator may further comprise a loading arm seating the wafer supporting system on the rotation chuck, wherein the detecting module detects whether the center of the wafer supporting system and the rotating center of the rotation chuck are aligned to vertically overlap each other, and if the center of the wafer supporting system and the rotating center of the rotation chuck do not overlap each other, the loading arm readjusts a seating position of the wafer supporting system.

The detecting module is positioned on a side surface of the wafer supporting system, and detects the height and the thickness of the side surface of the glue layer while the wafer supporting system is rotated.

The detecting module and the laser module are bonded to be fixed to each other.

The initiator may further comprise a presser applying a force onto the wafer supporting system to prevent the glue layer from bursting open.

The detecting module is spaced apart from the wafer supporting system, and the detecting module comprises a first position control module adjusting a height and a horizontal position of the detecting module.

The laser module is spaced apart from the wafer supporting system, and the laser module comprises a second position control module adjusting a height and a horizontal position of the laser module.

The second position control module adjusts the height of the laser module according to the height and the thickness of the glue layer.

The glue layer comprises a first glue layer formed on an upper surface of the carrier wafer and a second glue layer formed on a side surface of the carrier wafer, and the laser module removes the second glue layer.

The device wafer comprises at least a through silicon via (TSV).

The fracture portion has a depth of 1 mm to 10 mm in a center direction from the side surface of the glue layer.

The fracture portion is formed on the overall side surface of the glue layer.

The detecting module comprises an image sensor capturing an image of the wafer supporting system.

According to other example embodiments, there is provided an initiator for debonding a wafer supporting system including a device wafer having a through silicon electrode, a glue layer formed on one surface of the device wafer, and a carrier wafer bonded to the glue layer, comprising a chuck having an upper surface on which the wafer supporting system is seated, a detecting module sensing a height and a thickness of the glue layer as rotating on a side surface of the wafer supporting system and a laser module forming a fracture portion through irradiating a side surface of the glue layer with a laser as rotating on the side surface of the wafer supporting system on the basis of the height and the thickness of the glue layer.

The detecting module and the laser module are bonded to each other to be rotated simultaneously.

BRIEF DESCRIPTION OF THE DRAWINGS

Example embodiments will be more clearly understood from the following detailed description taken in conjunction with the accompanying drawings.

FIG. 1 is a side view explaining an initiator for debonding a wafer supporting system according to some example embodiments;

FIG. 2 is a plan view explaining an initiator for debonding a wafer supporting system of FIG. 1;

FIG. 3 is a block diagram explaining an initiator for debonding a wafer supporting system of FIG. 1;

FIG. 4 is a side view explaining in detail a wafer supporting system of FIG. 1;

FIG. 5 is a side view explaining in detail a device wafer of FIG. 4;

FIG. 6 is a side view explaining in detail a glue layer of FIG. 4;

FIGS. 7 to 9 are exemplary views explaining a fracture portion of FIG. 6;

FIG. 10 is a side view explaining an initiator for debonding a wafer supporting system according to other example embodiments;

FIG. 11 is a side view explaining realignment of a wafer supporting system of an initiator for debonding the wafer supporting system of FIG. 10;

FIG. 12 is a side view explaining an initiator for debonding a wafer supporting system according to still other example embodiments;

FIG. 13 is a front view explaining in detail a detecting module and a laser module of FIG. 12;

FIG. 14 is a side view explaining an initiator for debonding a wafer supporting system according to still yet example embodiments;

FIG. 15 is a side view explaining in detail a detecting module of an initiator for debonding a wafer supporting system according to still yet example embodiments;

FIG. 16 is a view explaining adjustment of the height and the horizontal position of a detecting module of FIG. 15;

FIG. 17 is a side view explaining in detail a laser module of an initiator for debonding a wafer supporting system according to still yet example embodiments;

FIG. 18 is a view explaining adjustment of the height and the horizontal position of a detecting module of FIG. 17;

FIG. 19 is a block diagram explaining an initiator for debonding a wafer supporting system according to still yet example embodiments;

FIG. 20 is a side view explaining an initiator for debonding a wafer supporting system according to still yet example embodiments;

FIG. 21 is a side view explaining an initiator for debonding a wafer supporting system according to still yet example embodiments;

FIG. 22 is a plan view explaining an initiator for debonding a wafer supporting system of FIG. 21;

FIG. 23 is a plan view explaining an initiator for debonding a wafer supporting system according to still yet embodiments;

FIG. 24 is a flowchart explaining a method for debonding a wafer supporting system according to still yet example embodiments;

FIG. 25 is a flowchart explaining in detail a step of providing a wafer supporting system of FIG. 24;

FIGS. 26 to 29 are views of intermediate steps explaining a method for debonding a wafer supporting system; and FIG. 30 is a flowchart explaining a method for debonding a wafer supporting system according to further example embodiments.

DETAILED DESCRIPTION OF EXAMPLE EMBODIMENTS

Figure 1:
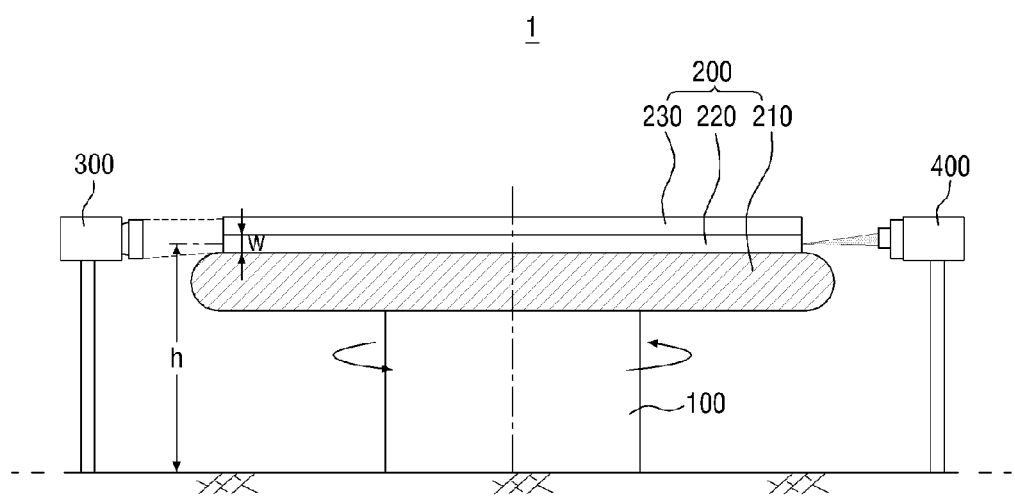
FIGS. 1-30 represent non-limiting, example embodiments as described herein.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section to without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, an initiator for debonding a wafer supporting system (WSS) according to a first embodiment of the inventive concept will be described with reference to FIGS. 1 to 9.

FIG. 1 is a side view explaining the initiator for debonding the wafer supporting system.

Referring to FIG. 1, the initiator 1 for debonding the wafer supporting system includes a rotation chuck 100, a detecting module 300, and a laser module 400.

The rotation chuck 100 may have a cylindrical body, but is not limited thereto. That is, the rotation chuck 100 may be in a column shape having a polygonal cross-section or in an elliptical shape.

A wafer supporting system 200 may be seated on an upper surface of the rotation chuck 100. The rotation chuck 100 may have a horizontal cross-section that is smaller than the horizontal cross-section of the wafer supporting system 200. Accordingly, the upper surface of the rotation chuck 100 may be entirely covered by the wafer supporting system 200, but is not limited thereto.

The rotation chuck 100 may rotate about a rotating center. The rotation chuck 100 may rotate the wafer supporting system 200. If the wafer supporting system 200 is circular, the rotating center of the rotation chuck 100 may vertically overlap the center of the circle of the wafer supporting system 200. That is, the wafer supporting system 200 may be aligned so that the rotating center of the rotation chuck 100 and the center of the wafer supporting system 200 coincide with each other.

The detecting module 300 may be positioned to be spaced apart from the rotation chuck 100 and the wafer supporting system 200. The detecting module 300 may be positioned on a side surface of the rotation chuck 100. The detecting module 300 may be positioned on a side surface of the wafer supporting system 200 that is seated on the upper surface of the rotation chuck 100. The detecting module 300 may be fixed to the side surface of the wafer supporting system 200 without movement.

The detecting module 300 may inspect the side surface of the wafer supporting system 200. Specifically, the detecting module 300 may inspect a glue layer 220 of the wafer supporting system 200. The glue layer 220 may be positioned between a carrier wafer 210 and a device wafer 230. The detecting module 300 may detect the height h and the thickness W of the glue layer 220.

The height h and the thickness W of the glue layer 220 may be exposed along the circumference of the wafer supporting system 200. The height h and the thickness W of the glue layer 220 may not be constant depending on the circumference of the wafer supporting system 200. Accordingly, if the wafer supporting system 200 is rotated by the rotation chuck 100, the detecting module 300 can measure the height h and the thickness W of the glue layer 220 along the circumference of the wafer supporting system 200.

The detecting module 300 may include an image sensor. That is, the detecting module 300 may detect the height h and the thickness W of the glue layer through capturing an image of a side surface of the wafer supporting system 200. For example, the detecting module 300 may include a CCD (Charge-Coupled Device) or a CIS (CMOS Image Sensor) as an image sensor, but is not limited thereto.

The laser module 400 may be positioned to be spaced apart from the rotation chuck 100 and the wafer supporting system 200. The laser module 400 may be positioned on a side surface of the rotation chuck 100. The laser module 400 may be positioned on the side surface of the wafer supporting system 200 that is seated on the upper surface of the rotation chuck 100. The laser module 400 may be fixed onto the side surface of the wafer supporting system 200 without movement. The laser module 400 may be positioned to be spaced apart from the detecting module 300. For example, as illustrated in FIG. 1, the laser module 400 may be positioned in an opposite direction to the detecting module 300 on the basis of the rotation chuck 100, but is not limited thereto. The laser module 400 may be positioned in any place where it can radiate light onto the side surface of the rotating wafer supporting system 200.

The laser module 400 may irradiate the glue layer 220 with the laser. The laser module 400 may form a fracture portion on the side surface of the glue layer 220 by irradiating the glue layer 220 with the laser. The laser module 400 may form the fracture portion on the side surface of the glue layer 220 using the height h and the thickness W of the glue layer 220 detected by the detecting module 300. The laser module 400 may irradiate only the glue layer 220 with the laser without damaging the carrier wafer 210 or the device wafer 230 using the height h and the thickness W of the glue layer 220.

Figure 2:
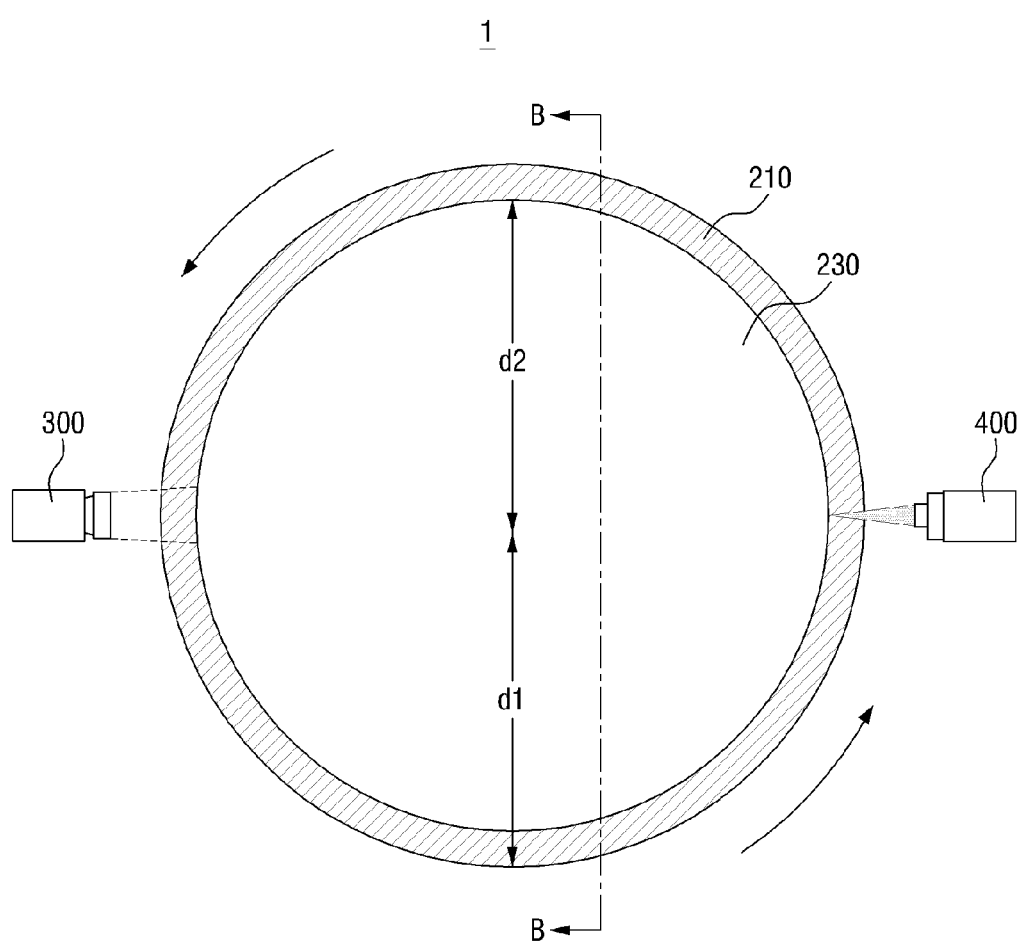

FIG. 2 is a plan view explaining an initiator for debonding a wafer supporting system of FIG. 1.

Referring to FIG. 2, the wafer supporting system 200 may be rotatably seated on the rotation chuck 100. The rotating direction may be the clockwise direction or the counter-clockwise direction. That is, the rotating direction is not limited in so far as the detecting module 300 and the laser module 400 can entirely inspect or fracture the side surface of the wafer supporting system 200.

The wafer supporting system 200 may include the carrier wafer 210, the device wafer 230, and the glue layer 220. The carrier wafer 210 and the device wafer 230 may be wafers in a circular plate shape. The carrier wafer 210 may have an area that is wider than the area of the device wafer 230. That is, the radius d1 of the carrier wafer 210 may be larger than or equal to the radius d2 of the device wafer 230, but is not limited thereto.

Figure 3:
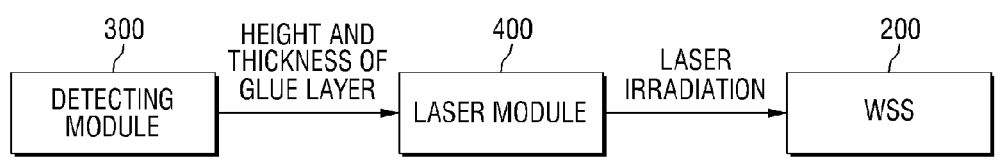

FIG. 3 is a block diagram explaining the initiator for debonding the wafer supporting system of FIG. 1.

Referring to FIG. 3, the detecting module 300 may detect the height and the thickness of the glue layer 220. That is, the detecting module 300 may detect the accurate height and thickness with respect to all exposed side surfaces of the glue layer 220.

The detecting module 300 may transmit the height and the thickness of the glue layer 220 to the laser module 400. The laser module 400 may irradiate the wafer supporting system 200 with the laser using the transmitted height and thickness information of the glue layer 220.

Figure 4:
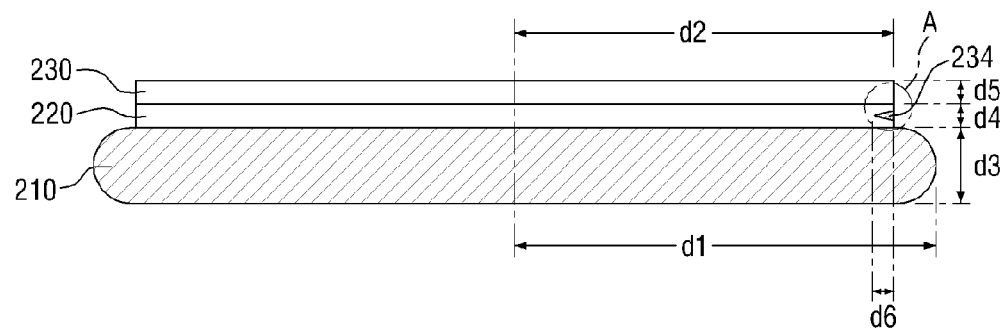
Figure 5:
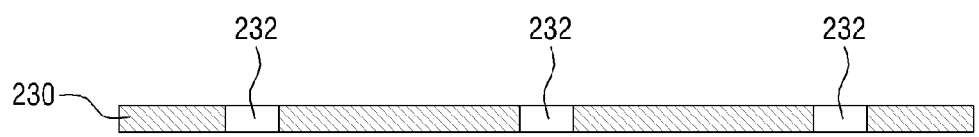

FIG. 4 is a side view explaining in detail the wafer supporting system of FIG. 1, and FIG. 5 is a side view explaining in detail a device wafer of FIG. 4. Specifically, FIG. 5 may be a cross-sectional view taken along line B-B'.

Referring to FIG. 4, the wafer supporting system 200 includes the carrier wafer 210, the device wafer 230, and the glue layer 220.

The carrier wafer 210 may be a dummy wafer that is bonded to heighten durability of the device wafer 230. The carrier wafer 210 may prevent the device wafer 230 from being damaged while the device wafer 230 forms a through silicon via (TSV).

The radius d2 of the carrier wafer 210 may be larger than or equal to the radius d1 of the device wafer 230, but is not limited thereto. However, in the case where the radius d2 of the carrier wafer 210 is larger than or equal to the radius d1 of the device wafer 230, durability of an edge portion of the device wafer 230 can be strengthened. The carrier wafer 210 may be in a circular plate shape.

The device wafer 230 may be a wafer on which an actual pattern is formed to be actually used as a semiconductor device. The device wafer 230 may be a wafer in a circular plate shape, which has first and second surfaces. Actual circuit patterns and bumps may be formed on the first surface. The first surface may be a surface on which the glue layer 220 is formed. That is, the first surface may be a surface to which the device wafer 230 and the carrier wafer 210 are bonded through the glue layer 220.

Referring to FIG. 5, the device wafer 230 may include at least one through silicon via (TSV) 232. The through silicon via 232 may penetrate the device wafer 230 so as to connect the first surface and the second surface of the device wafer 230 to each other.

The through silicon via 232 may serve to connect respective chips to each other in a structure in which semiconductor chips are stacked in a semiconductor package process later. Further, the through silicon via may serve to connect the chips and the substrate to each other. That is, the through silicon via 232 is a path that connects 3D semiconductor packages in the shortest distance, and can provide semiconductor packages having a speed that is much faster than the speed of the existing wire bonding or flipchip bonding.

Referring again to FIG. 4, the glue layer 220 may be positioned between the carrier wafer 210 and the device wafer 230. The glue layer 220 may be spread as a viscous semi-liquid, and then may be cured to bond the carrier wafer 210 and the device wafer 230 to each other. In general, the glue layer 220 is evenly spread, but may not be evenly spread due to several causes.

The thickness d3 of the carrier wafer 210 may be larger than or equal to the thickness d4 of the glue layer 220. The thickness d5 of the device wafer 230 may be thinner than or equal to the thickness d3 of the carrier wafer 210 and the thickness d4 of the glue layer 220. That is, the device wafer 230 may be thinnest.

The through silicon via 232 may be formed on the device wafer 230. The forming of the through silicon via 232 may cause big mechanical stress on the thin device wafer 230. Accordingly, the carrier wafer 210 having large volume may be bonded to the device wafer 230 through the glue layer 220 to prevent the damage of the device wafer 230 while the through silicon via 232 is formed.

That is, the carrier wafer 210 may be separated from the device wafer 230 after the through silicon via 232 is formed. According to the first embodiment of the present inventive concept, the initiator 1 for debonding the wafer supporting system is a device to start such a separation process.

Referring to portion A of FIG. 4, the glue layer 220 may include a fracture portion 234 by means of the laser module 400. The fracture portion 234 is a portion from which the glue layer 220 is removed. The device wafer 230 and the carrier wafer 210 may be separated from each other on the basis of the fracture portion 234 later. The depth d6 of the fracture portion 234 may differ depending on the size of the wafer supporting system 200 and other process conditions. However, the depth of the fracture portion 234 may be quite smaller than the size of the wafer supporting system 200. For example, in the case of the wafer supporting system 200 that includes the carrier wafer 210 having a diameter of 300 mm, the depth of the fracture portion 234 may be about 1 mm to 10 mm. This is because if the depth of the fracture portion 234 is smaller than 1 mm, it may be difficult to perform the debonding process, while if the depth of the fracture portion 234 exceeds 10 mm, the device wafer 230 to may be damaged.

Figure 6:
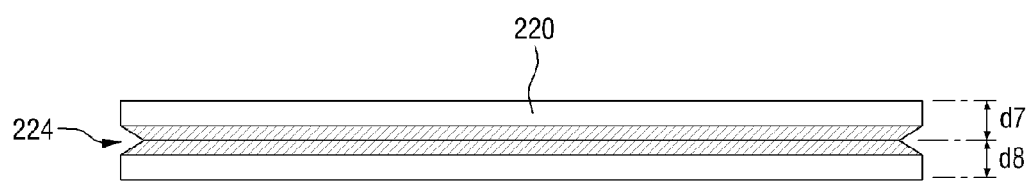

FIG. 6 is a side view explaining in detail a glue layer of FIG. 4, and FIGS. 7 to 9 are exemplary views explaining a fracture portion of FIG. 6.

Referring to FIG. 6, the fracture portion 234 of the glue layer 220 may be formed along the outer circumference of the glue layer 220. The fracture portion 234 may be extended without cease to form one portion, but is not limited thereto.

The fracture portion 234 may be formed in a vertical center portion of the glue layer 220. That is, the distance d7 between the fracture portion 234 and the upper surface of the glue layer may be equal or similar to the distance d8 between the fracture portion 234 and a lower surface of the glue layer 220.

Figure 7:
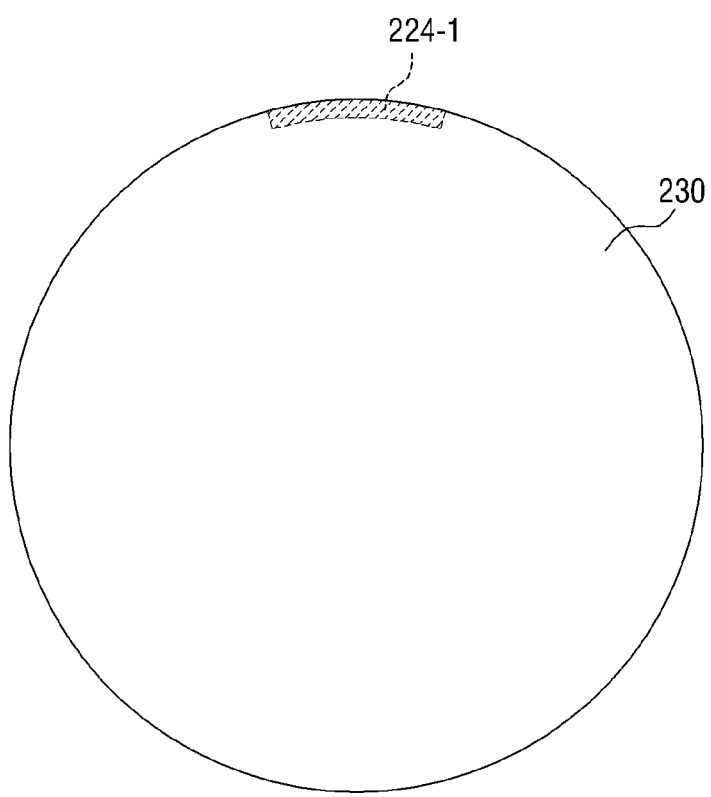
Figure 8:
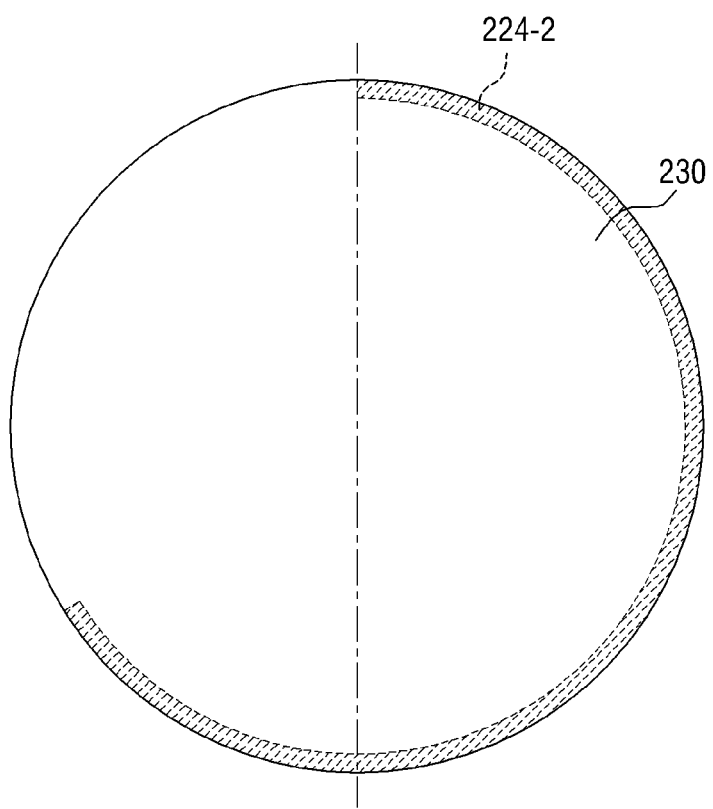
Figure 9:
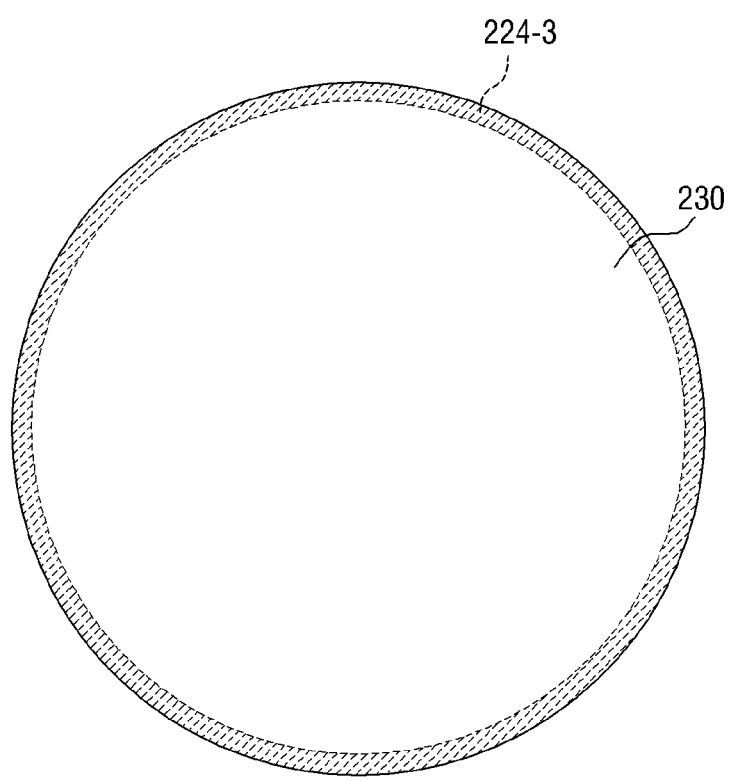

Referring to FIGS. 7 to 9, the extended length of the fracture portion 234 is not specially limited. That is, referring to FIG. 7, a fracture portion 234-1 may occupy only a small portion of the outer circumference of the glue layer 220. The size of such a fracture portion 234-1 may be selected to heighten the processing speed and the operation amount through minimizing detection of the height and the thickness of the glue layer 220 of the detecting module 300.

Referring to FIG. 8, a fracture portion 234-2 may be formed over more than half of the outer circumference of the glue layer 220. The size of such a fracture portion 234-2 may cause the height and the thickness of the glue layer 220 of the detecting module 300 to be increased, and may cause laser irradiation of the laser module 400 to be increased. In contrast, easier debonding can be performed in the debonding process of the wafer supporting system 200. That is, as the length of the fracture portion 234-2 is increased, the debonding of the wafer supporting system can be performed more easily.

Referring to FIG. 9, a fracture portion 234-3 may be further extended and formed over the entire outer circumference of the glue layer 220 as compared with that in FIGS. 7 and 8. In this case, the debonding process of the wafer supporting system 200 can be performed most easily. Accordingly, a semiconductor device having the highest reliability can be manufactured.

As described above, according to the initiator 1 for debonding the wafer supporting system according to the first embodiment of the inventive concept, the reliability and the processing speed of the device can be adjusted through selection of the length of the fracture portion 234. That is, the length of the fracture portion 234 can be selected to achieve the desired reliability and processing speed.

The existing initiator for debonding the wafer supporting system is of a blade type to having a thin blade. This blade type initiator is a device that makes a peel-off start point through physically cutting the glue layer 220 of the wafer supporting system 200 for debonding.

Such a device may damage the recent high-integrated semiconductor device in a state where the structure or bump density is gradually increased in the device wafer 230. This is because the thickness of the glue layer 220 is decreased as the structure of the device wafer 230 is miniaturized, and thus it is not easy to fracture the glue layer 220 having such a fine level. That is, the blade type initiator may cause the occurrence of a crack in the structure of the device wafer 230, and due to such a crack, a circuit in the device wafer 230 may be damaged.

Further, as the crack is propagated, even a portion which is simply damaged, i.e., in which the crack does not occur, may be damaged to cause the entire device wafer 230 to be damaged.

Unlike this, the initiator 1 for debonding the wafer supporting system according to the first embodiment of the inventive concept can finely adjust the initiating using a laser rather than the mechanical blade, and the laser irradiation position can be calculated and precisely adjusted in advance through the detecting module 300. Accordingly, the crack occurrence and inferiority of the device wafer 230 can be greatly reduced.

Hereinafter, referring to FIGS. 10 and 11, an initiator for debonding a wafer supporting system according to a second embodiment of the inventive concept will be described. This embodiment is the same as the first embodiment as described above except that this embodiment further includes a loading arm and a different detecting module, and thus the duplicate explanation thereof will be simplified or omitted.

Figure 10:
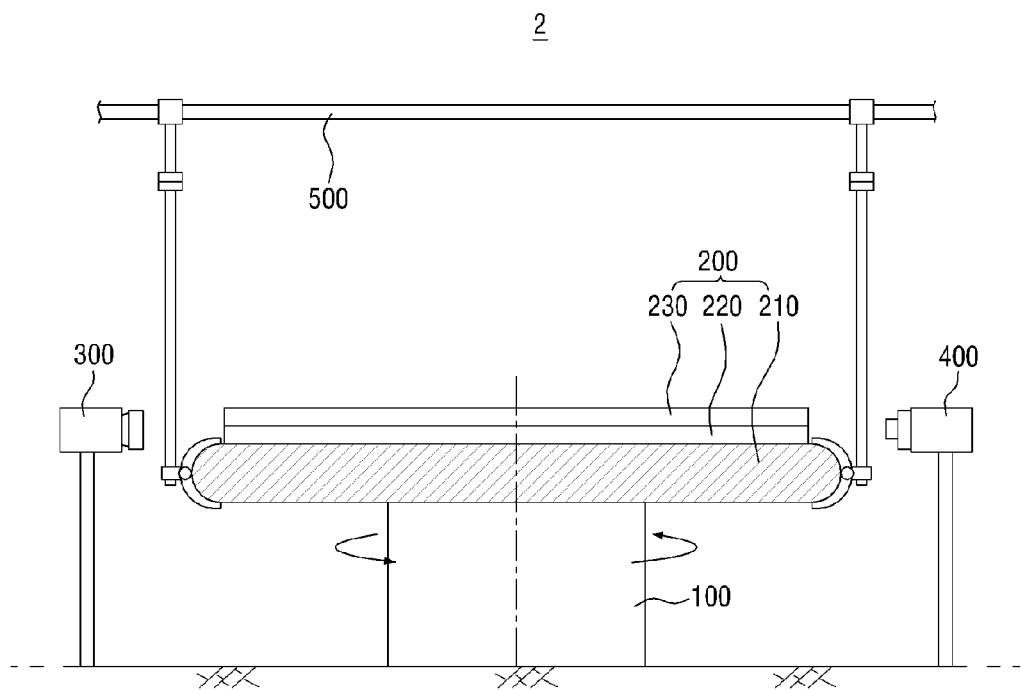

FIG. 10 is a side view explaining an initiator for debonding a wafer supporting system according to a second embodiment of the inventive concept.

Referring to FIG. 10, an initiator 2 for debonding a wafer supporting system according to the second embodiment of the inventive concept further includes a loading arm 500.

The loading arm 500 can load a wafer supporting system 200 onto a rotation chuck 100. FIG. 10 illustrates that the loading arm 500 is coupled to a side surface of the carrier wafer 210, but this is merely exemplary. The coupling portion or method through which the loading arm 500 is coupled to the wafer supporting system 200 is not limited in so far as the loading arm 500 can safely move and load the wafer supporting system 200 onto the rotation chuck 100.

The loading arm 500 can load the wafer supporting system 200 so that the rotating center of the rotation chuck 100 overlaps the center of the wafer supporting system 200 that has a stacked structure of a circular plate shape.

Figure 11:
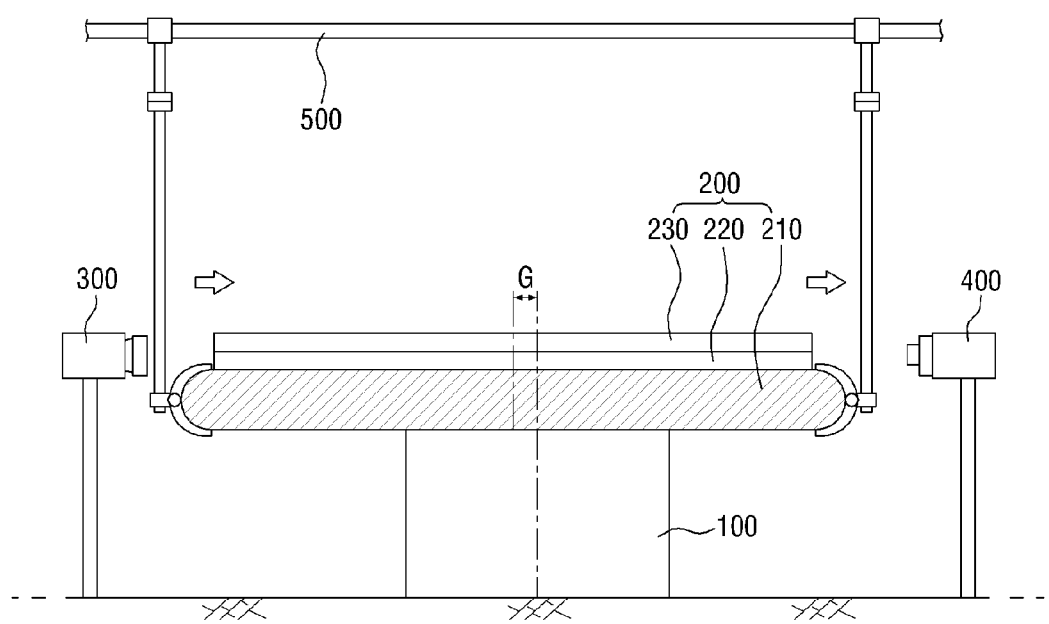

FIG. 11 is a side view explaining realignment of a wafer supporting system of an initiator for debonding the wafer supporting system of FIG. 10.

Referring to FIG. 11, the wafer supporting system 200 and the rotation chuck 100 may not be aligned with each other. In this case, the rotating center of the rotation chuck 100 and the center of the wafer supporting system 200 may have a misalignment gap G therebetween.

That is, as the rotation chuck 100 is rotated, the track drawn by the wafer supporting system 200 may become irregular to cause damage to the wafer supporting system 200. In this case, realignment of the wafer supporting system 200 is required.

The detecting module 300 may detect the misalignment gap G between the center of the wafer supporting system 200 and the rotating center of the rotation chuck 100 through sensing of the side surface of the rotating wafer supporting system 200. That is, as the wafer supporting system 200 is rotated, the distance between the detecting module 300 and the wafer supporting system 200 is continuously changed, and through this, the detecting module 300 can detect the misalignment.

If the misalignment gap G exceeds a preset threshold value, the loading arm 500 may realign the wafer supporting system 200. The loading arm 500 may receive information on the misalignment gap G that is transmitted from the detecting module 300 and may realign the wafer supporting system 200 using the received information.

The initiator 2 for debonding the wafer supporting system according to this embodiment may perform the alignment of the wafer supporting system 200 more precisely through the loading arm 500. Further, if the wafer supporting system 200 is misaligned, the detecting module 300 senses this, and the loading arm 500 performs again the alignment of the wafer supporting system 200. Accordingly, the debonding initiating of the wafer supporting system 200 can be performed smoothly.

Hereinafter, referring to FIGS. 12 and 13, an initiator for debonding a wafer supporting system according to a third embodiment of the inventive concept will be described. This embodiment is the same as the first embodiment as described above except that a laser module and a detecting module are bonded to each other to come in contact with each other in this embodiment, and thus the duplicate explanation thereof will be simplified or omitted.

Figure 12:
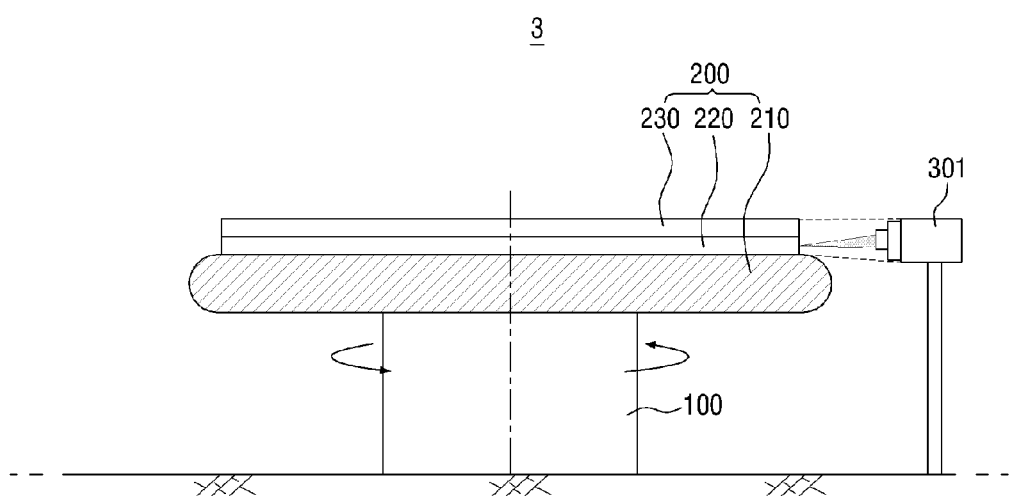
Figure 13:
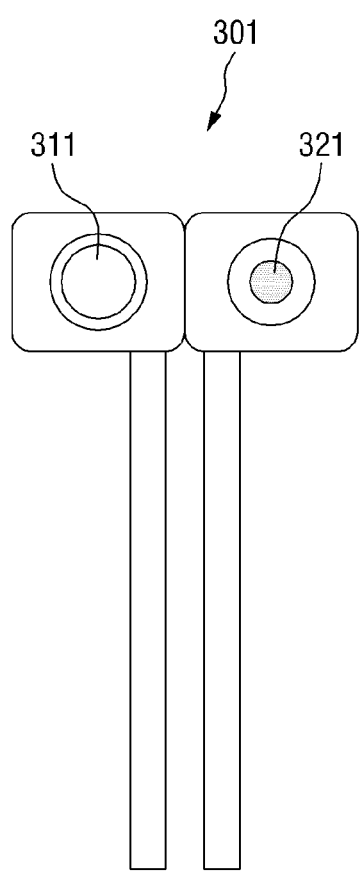

FIG. 12 is a side view explaining an initiator for debonding a wafer supporting system according to a third embodiment of the inventive concept, and FIG. 13 is a front view explaining in detail a detecting module and a laser module of FIG. 12.

Referring to FIGS. 12 and 13, an initiator 3 for debonding a wafer supporting system according to a third embodiment of the inventive concept includes a dual module 301 instead of a laser module and a detecting module.

The dual module 301 may be positioned to be spaced apart from the rotation chuck 100 and the wafer supporting system 200. The dual module 301 may be positioned on the side surface of the rotation chuck 100. The dual module 301 may be positioned on the side surface of the wafer supporting system 200 that is seated on the upper surface of the rotation chuck 100. The dual module 301 may be fixed to the side surface of the wafer supporting system 200 without movement.

The dual module 301 may include a detecting part 311 and a laser part 321. The detecting part 311 and the laser part 321 may be bonded to each other to be integrally formed. The detecting part 311 and the laser part 321 may be fixed to each other. Accordingly, the detecting part 311 and the laser part 321 may perform their respective functions in positions that are adjacent to each other.

The detecting part 311 may inspect the side surface of the wafer supporting system 200. Specifically, the detecting part 311 may inspect the glue layer 220 of the wafer supporting system 200. The glue layer 220 may be positioned between the carrier wafer 210 and the device wafer 230 of the wafer supporting system 200. The detecting part 311 may detect the height and the thickness of the glue layer 220.

The height and the thickness of the glue layer 220 may be exposed along the circumference of the wafer supporting system 200. The height and the thickness of the glue layer 220 may not be constant depending on the circumference of the wafer supporting system 200. Accordingly, if the wafer supporting system 200 is rotated by the rotation chuck 100, the detecting part 311 can measure the height and the thickness of the glue layer 220 along the circumference of the wafer supporting system 200.

The detecting part 311 may include an image sensor. That is, the detecting module 311 may detect the height and the thickness of the glue layer through capturing an image of the side surface of the wafer supporting system 200. For example, the detecting part 311 may include a CCD (Charge-Coupled Device) or a CIS (CMOS Image Sensor) as an image sensor, but is not limited thereto.

The laser part 321 may irradiate the glue layer 220 with laser. The laser part 321 may form a fracture portion on the side surface of the glue layer 220 by irradiating the glue layer 220 with the laser. The laser part 321 may form the fracture portion on the side surface of the glue layer 220 using the height and the thickness of the glue layer 220 detected by the detecting part 311. The laser part 321 may irradiate only the glue layer 220 with the laser without damaging the carrier wafer 210 or the device wafer 230 using the height and the thickness of the glue layer 220.

The dual module 301 may include the laser part 321 and the detecting part 311 together. Through this, the height and the vertical position in which the detecting part 311 measures the height and the thickness of the glue layer 220 may be equal to or similar to the height and the vertical position in which the laser part 321 radiates the laser. Accordingly, the position adjustment of the laser part 321 can be performed more easily and precisely in comparison to the case where the laser part 321 and the detecting part 311 are separated from each other. Further, since information measured in the detecting part 311 is used in the adjacent laser part 321, the transmission path is shortened to heighten the reliability and efficiency.

Hereinafter, referring to FIG. 14, an initiator for debonding a wafer supporting system according to a fourth embodiment of the inventive concept will be described. This embodiment is the same as the first embodiment as described above except that this embodiment further includes a presser. Accordingly, the duplicate explanation thereof will be simplified or omitted.

Figure 14:
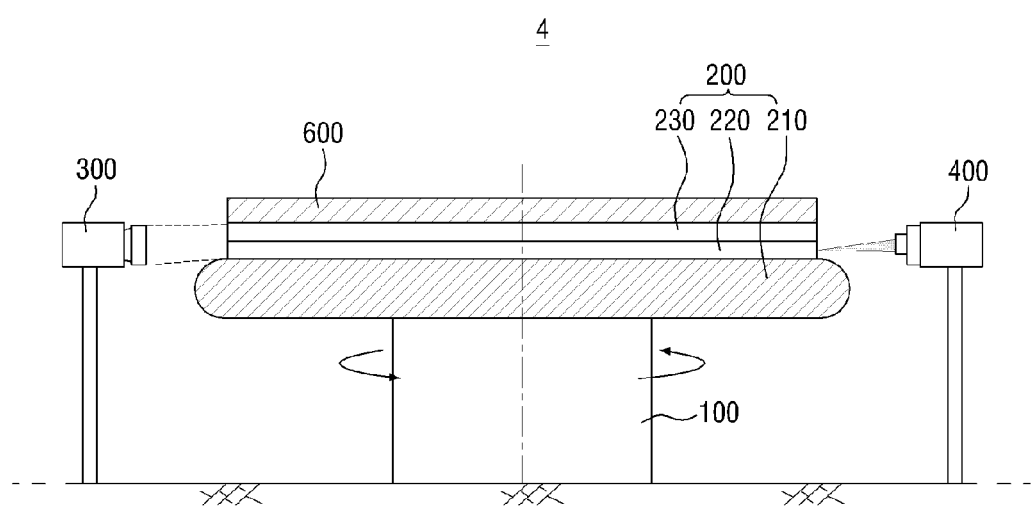

FIG. 14 is a side view explaining an initiator for debonding a wafer supporting system according to a fourth embodiment of the inventive concept.

Referring to FIG. 14, an initiator 4 for debonding a wafer supporting system according to a fourth embodiment of the inventive concept further includes a presser 600.

The presser 600 may apply a downward load to the wafer supporting system 200 on the upper surface of the wafer supporting system 200. Specifically, the presser 600 may be put on the device wafer 230 of the wafer supporting system 200. It is sufficient that the presser 600 is an object having a predetermined weight, and the shape thereof is not limited.

The presser 600 may prevent the glue layer 220 that is positioned on the fracture portion from rising upward when the fracture portion of the glue layer 220 is formed by the laser module 400.

Once the glue layer 220 is fractured, no force acts on the lower surface of the upper portion of the separated glue layer 220 due to a tensile force, but a pulling force acts on the upper surface thereof due to bonding with the device wafer 230. Accordingly, due to a difference between such tensile forces, the upper portion of the separated glue layer 220 may rise upward around the fracture portion.

The presser 600 may apply a force downward through the load acting on the upper surface of the device wafer 230 in order to prevent the glue layer 220 from being separated and rising. Accordingly, even if the fracture portion is formed, the glue layer 220 can maintain its original position without being separated.

Once the glue layer 220 rises, the device wafer 230 that is bonded to the glue layer 220 may receive a bending force to be damaged. Accordingly, the presser 600 can prevent the damage due to the bending of the device wafer 230.

Hereinafter, referring to FIGS. 15 and 16, an initiator for debonding a wafer supporting system according to a fifth embodiment of the inventive concept will be described. This embodiment is the same as the first embodiment as described above except that a detecting module further includes a first position control module, and thus the duplicate explanation thereof will be simplified or omitted.

Figure 15:
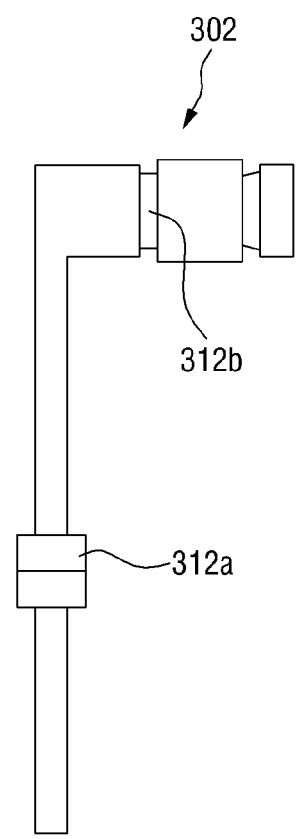
Figure 16:
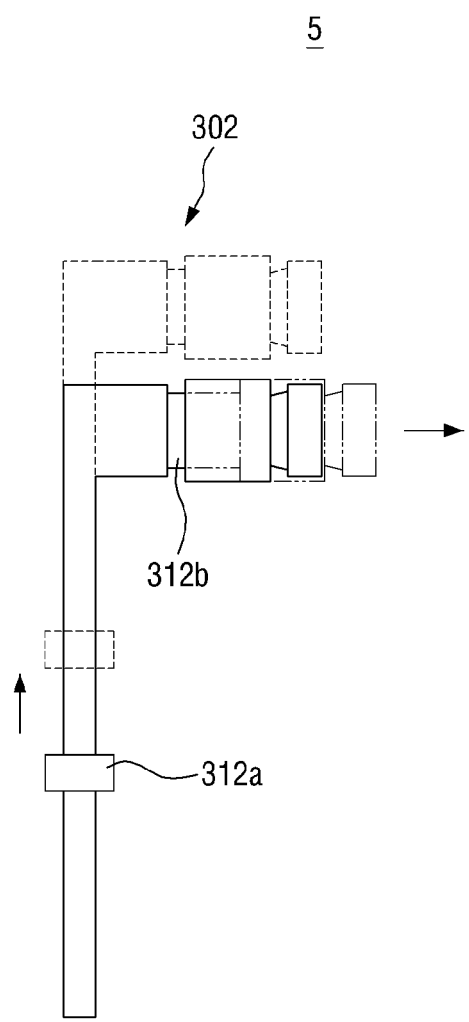

FIG. 15 is a side view explaining in detail a detecting module of an initiator for debonding a wafer supporting system according to a fifth embodiment of the inventive concept, and FIG. 16 is a view explaining height and horizontal position adjustment of the detecting module of FIG. 15.

Referring to FIGS. 15 and 16, an initiator 5 for debonding a wafer supporting system according to a fifth embodiment of the inventive concept includes a detecting module 302.

The detecting module 302 may be positioned to be spaced apart from the rotation chuck 100 and the wafer supporting system 200. The detecting module 302 may be positioned on the side surface of the rotation chuck 100. The detecting module 302 may be positioned on the side surface of the wafer supporting system 200 that is seated on the upper surface of the rotation chuck 100. The detecting module 302 may be fixed to the side surface of the wafer supporting system 200 without movement.

However, the detecting module 302 includes a first position control module 312. That is, the position of the detecting module 302 may be controlled by the first position control module 312.

Specifically, the first position control module 312 may control both the horizontal position and the vertical position, but is not limited thereto. However, in order to measure the height and the thickness of the glue layer 220, it is required to control the vertical position. Further, the focal distance of the image sensor of the detecting module 302 may be controlled through adjustment of the distance from the glue layer 220.

FIGS. 15 and 16 illustrate that a portion 312a that controls the vertical distance and a portion 312b that controls the horizontal distance are separated from each other. However, this is merely exemplary, and both portions may be integrally formed.

Hereinafter, referring to FIGS. 17 to 19, an initiator for debonding a wafer supporting system according to a sixth embodiment of the inventive concept will be described. This embodiment is the same as the first embodiment as described above except that a laser module further includes a second position control module, and thus the duplicate explanation thereof will be simplified or omitted.

Figure 17:
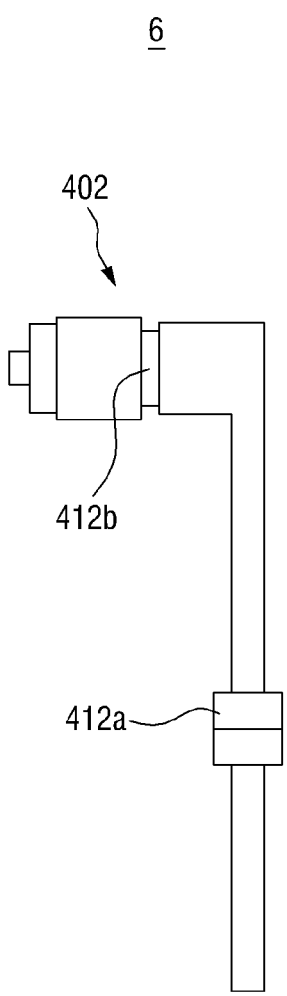
Figure 18:
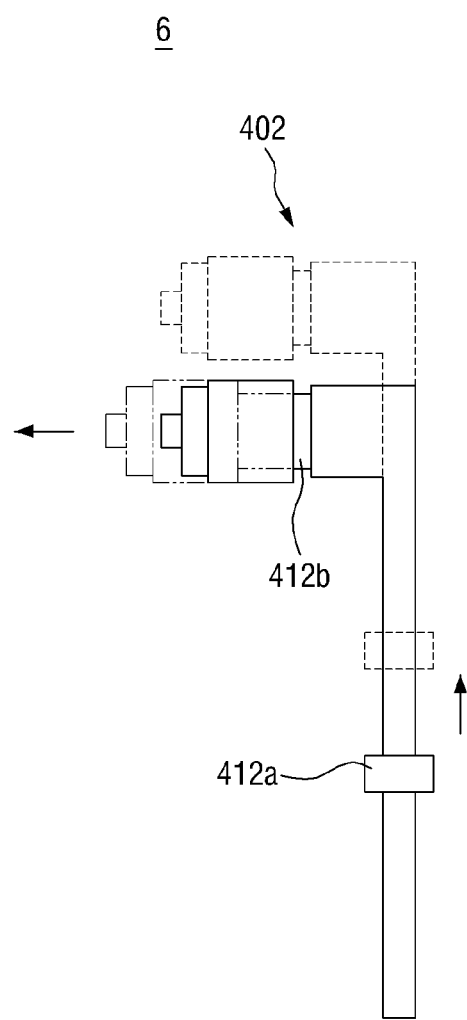

FIG. 17 is a side view explaining in detail a laser module of an initiator for debonding a wafer supporting system according to a sixth embodiment of the inventive concept, and FIG. 18 is a view explaining height and horizontal position adjustment of the detecting module of FIG. 17.

Referring to FIGS. 17 and 18, an initiator 6 for debonding a wafer supporting system according to a sixth embodiment of the inventive concept includes a laser module 402.

The laser module 402 may be positioned to be spaced apart from the rotation chuck 100 and the wafer supporting system 200. The laser module 402 may be positioned on the side surface of the rotation chuck 100. The laser module 402 may be positioned on the side surface of the wafer supporting system 200 that is seated on the upper surface of the rotation chuck 100. The laser module 402 may be fixed to the side surface of the wafer supporting system 200 without movement. The laser module 402 may be positioned to be spaced apart from the detecting module 300. For example, the laser module 402 may be positioned in an opposite direction to the detecting module 300 on the basis of the rotation chuck 100, but is not limited thereto. The laser module 402 may be positioned in any position where it can radiate light onto the side surface of the rotating wafer supporting system 200 without limit.

However, the laser module 402 includes a second position control module 412. That is, the position of the laser module 402 may be controlled by the second position control module 412.

Specifically, the second position control module 412 may control both the horizontal position and the vertical position, but is not limited thereto. However, in order to radiate the laser to match the height and the thickness of the glue layer 220, it is required to control the vertical position. Further, the strength of the laser of the laser module 402 and the size of a spot region may be controlled through adjustment of the distance between the laser module 402 and the glue layer 220.

FIGS. 17 and 18 illustrate that a portion 412a that controls the vertical distance and a portion 412b that controls the horizontal distance are separated from each other. However, this is merely exemplary, and both portions may be integrally formed.

Figure 19:
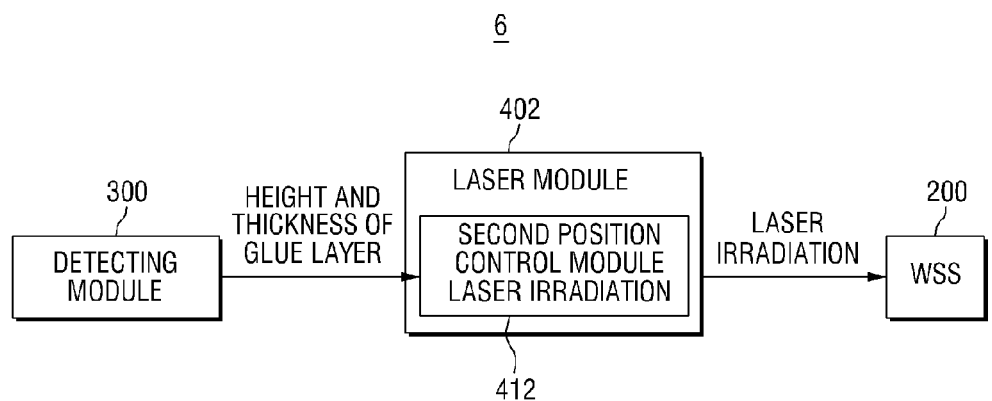

FIG. 19 is a block diagram explaining an initiator for debonding a wafer supporting system according to a sixth embodiment of the inventive concept.

Referring to FIG. 19, the detecting module 300 may detect and transmit the height and the thickness of the glue layer to the laser module 402. The height and the thickness of the glue layer may be transmitted to the second position control module 412 of the laser module 402. The second position control module 412 may control the vertical position and the horizontal direction of the laser module 402 on the basis of the height and the thickness of the glue layer.

Through this, the laser module 402 may accurately irradiate the wafer supporting system 200 with the laser. Of course, the laser irradiation position may not be determined only by the adjustment of the horizontal position and the vertical position of the laser module 402. After the position of the laser module 402 is adjusted, the irradiation angle of the laser module 400 may be finely adjusted. Accordingly, the laser can be irradiated at the accurate position of the glue layer 220 of the wafer supporting system 200.

Hereinafter, referring to FIG. 20, an initiator for debonding a wafer supporting system according to a seventh embodiment of the inventive concept will be described. This embodiment is the same as the first embodiment as described above except that a glue layer includes first and second glue layers and a laser module removes the second glue layer, and thus the duplicate explanation thereof will be simplified or omitted.

Figure 20:
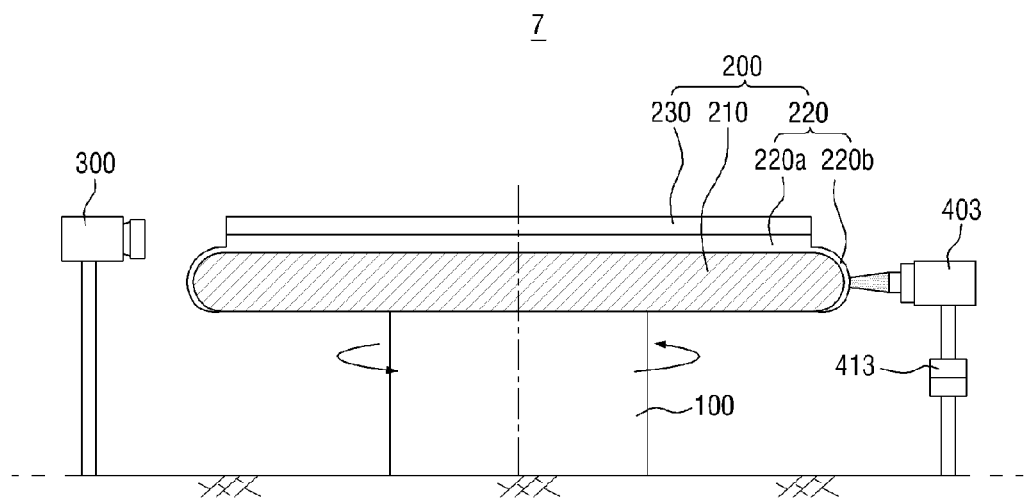

FIG. 20 is a side view explaining an initiator for debonding a wafer supporting system according to a seventh embodiment of the inventive concept.

Referring to FIG. 20, an initiator 7 for debonding a wafer supporting system according to the seventh embodiment of the inventive concept includes a laser module 403.

The glue layer 220 of the wafer supporting system 200 includes a first glue layer 220a and a second glue layer 220b. The first glue layer 220a may be formed on the upper surface of the carrier wafer 210. The first glue layer 220a may be formed on the lower surface of the device wafer 230. That is, the first glue layer 220a may be formed between the carrier wafer 210 and the device wafer 230. The first glue layer 220a may bond the carrier wafer 210 and the device wafer 230 to each other.

The second glue layer 220b may be formed on the side surface of the carrier wafer 210. The second glue layer 220b may be extended from the first glue layer 220a. The glue layer 220 may be formed in a manner that viscous liquefied glue is applied onto the upper surface of the carrier wafer 210, is evenly spread through the rotation of the carrier wafer, and then is cured. The second glue layer 220b may be formed by the glue that flows to the side surface through the upper surface of the carrier wafer 210 by a centrifugal force while the glue is evenly spread through the rotation of the carrier wafer.

That is, the second glue layer 220b may be unintentionally formed in the process of forming the glue layer 220. The second glue layer 220b may deteriorate the efficiency in the subsequent process of separating the device wafer 230 and the carrier wafer 210 from each other. Further, the second glue layer 220b may cause problems during loading of the wafer supporting system 200 or in other subsequent processes. Accordingly, the second glue layer 220b is removed to heighten reliability of the semiconductor device.

The laser module 403 may remove the second glue layer 220b. The laser module 403 may control the vertical position and the horizontal position using a position control module 413. Accordingly, the laser module 403 may form a fracture portion on the first glue layer 220a and may remove the second glue layer 220b through adjustment of the position thereof.

The initiator 7 for debonding the wafer supporting system according to the seventh embodiment of the inventive concept may remove the second glue layer 220b that may act as an impurity to heighten reliability of the device wafer 230.

Hereinafter, referring to FIGS. 21 and 22, an initiator for debonding a wafer supporting system according to an eighth embodiment of the inventive concept will be described. This embodiment is the same as the first embodiment as described above except that a chuck is included instead of a rotation chuck, a detecting module and a laser module are rotated, and a rotation guide module is further included. Accordingly, the duplicate explanation thereof will be simplified or omitted.

Figure 21:
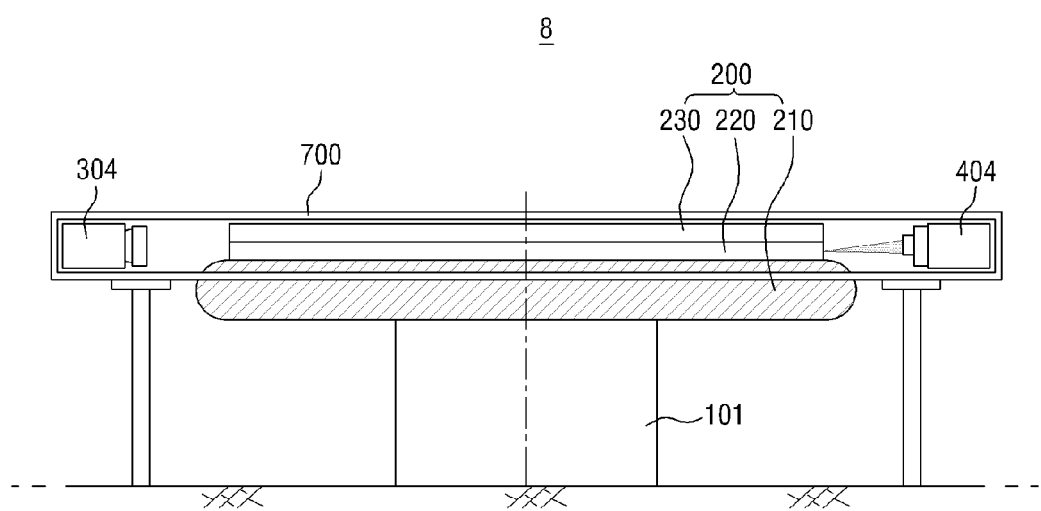
Figure 22:
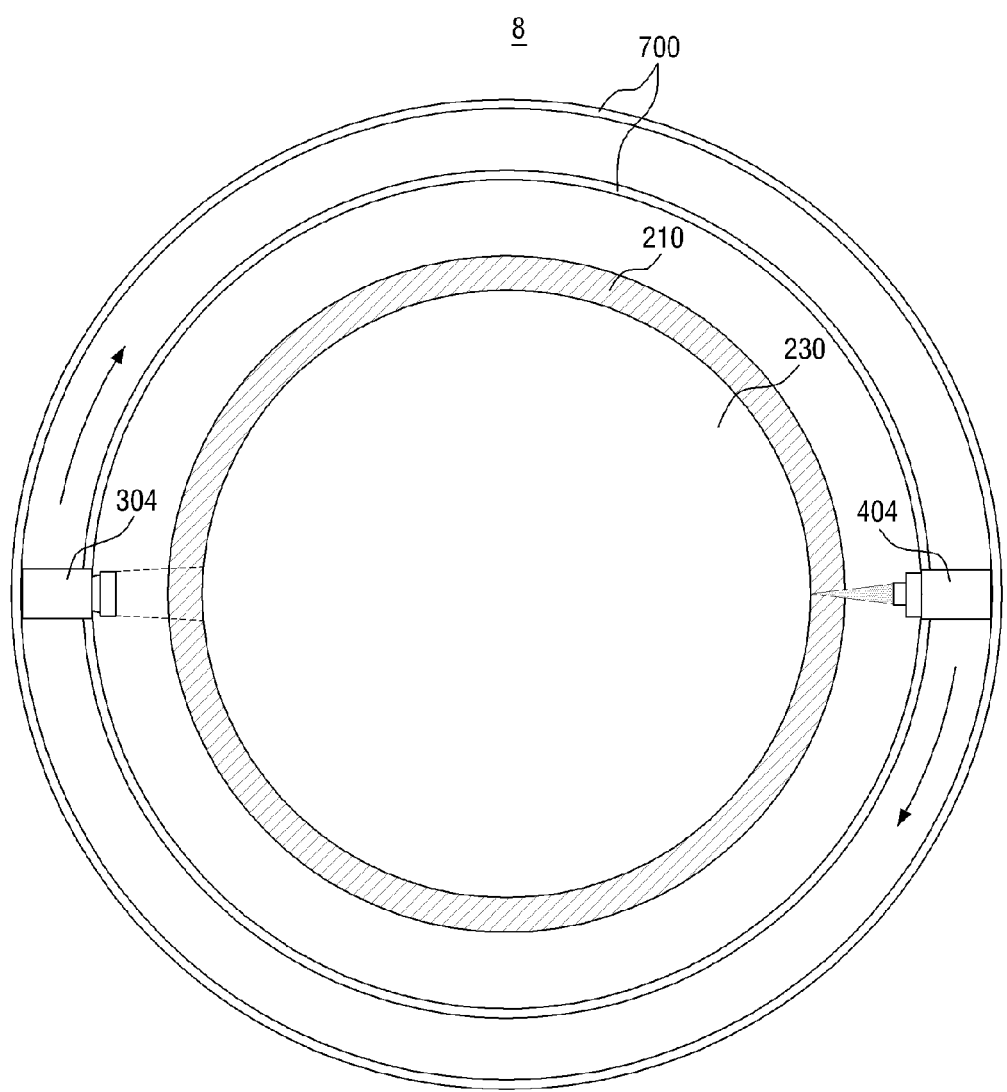

FIG. 21 is a side view explaining an initiator for debonding a wafer supporting system according to an eighth embodiment of the inventive concept, and FIG. 22 is a plan view explaining an initiator for debonding a wafer supporting system of FIG. 21.

Referring to FIGS. 21 and 22, an initiator 8 for debonding a wafer supporting system according to an eighth embodiment of the present inventive concept includes a chuck 101, a detecting module 304, a laser module 404, and a rotation guide module 700.

The chuck 101 may have a cylindrical body, but is not limited thereto. That is, the chuck 101 may be in a column shape having a polygonal cross-section or in an elliptical shape.

A wafer supporting system 200 may be seated on an upper surface of the chuck 101. The chuck 101 may have a horizontal cross-section that is smaller than the horizontal cross-section of the wafer supporting system 200 that is seated on the upper surface of the chuck 101. Accordingly, the upper surface of the chuck 101 may be entirely covered by the wafer supporting system 200, but is not limited thereto.

The detecting module 304 may be positioned to be spaced apart from the chuck 101 and the wafer supporting system 200. The detecting module 304 may be positioned on the side surface of the chuck 101. The detecting module 304 may be positioned on the side surface of the wafer supporting system 200 that is seated on the upper surface of the chuck 101.

The detecting module 304 may be rotated on the side surface of the wafer supporting system 200. The detecting module 304 may be rotated along the circumference of the wafer supporting system 200. That is, the detecting module 304 may sense the glue layer 220 of the wafer supporting system 200 as rotating about the wafer supporting system 200. The detecting module 304 may be rotated along the rotation guide module 700.

The detecting module 304 may inspect the side surface of the wafer supporting system 200. Specifically, the detecting module 304 may inspect the glue layer 220 of the wafer supporting system 200. The glue layer 220 may be positioned between the carrier wafer 210 and the device wafer 230. The detecting module 304 may detect the height and the thickness of the glue layer 220.

The height and the thickness of the glue layer 220 may be exposed along the circumference of the wafer supporting system 200. The height and the thickness of the glue layer 220 may not be constant depending on the circumference of the wafer supporting system 200. Accordingly, the detecting module 304 can measure the height and the thickness of the glue layer 220 along the circumference of the wafer supporting system 200 as being rotated by the rotation guide module 700.

The detecting module 304 may include an image sensor. That is, the detecting module 304 may detect the height and the thickness of the glue layer through capturing an image of the side surface of the wafer supporting system 200. For example, the detecting module 304 may include a CCD (Charge-Coupled Device) or a CIS (CMOS Image Sensor) as an image sensor, but is not limited thereto.

The laser module 404 may be positioned to be spaced apart from the chuck 101 and the wafer supporting system 200. The laser module 404 may be positioned on the side surface of the chuck 101. The laser module 404 may be positioned on the side surface of the wafer supporting system 200 that is seated on the upper surface of the chuck 101.

The laser module 404 may be rotated on the side surface of the wafer supporting system 200. The laser module 404 may be rotated along the outer circumference of the wafer supporting system 200. That is, the laser module 404 may irradiate the glue layer 220 of the wafer supporting system 200 with a laser as being rotated about the wafer supporting system 200. The laser module 404 may be rotated along the rotation guide module 700.

The laser module 404 may be positioned to be spaced apart from the detecting module 304. For example, as illustrated in FIG. 21, the laser module 404 may be positioned in an opposite direction to the detecting module 304 on the basis of the chuck 101, but is not limited thereto. The laser module 404 may be positioned in any place where it can radiate light onto the side surface of the fixed rotating wafer supporting system 200 as being rotated on the side surface of the wafer supporting system 200.

The laser module 404 may irradiate the glue layer 220 with a laser. The laser module 404 may form a fracture portion on the side surface of the glue layer 220 by irradiating the glue layer 220 with the laser. The laser module 404 may form the fracture portion on the side surface of the glue layer 220 using the height and the thickness of the glue layer 220 detected by the detecting module 304. The laser module 404 may irradiate only the glue layer 220 with the laser without damaging the carrier wafer 210 or the device wafer 230 using the height and the thickness of the glue layer 220.

The rotation guide module 700 can rotate the detecting module 304 around the chuck 101. The rotation guide module 700 may rotate the detecting module 304 along the outer circumference of the wafer supporting system 200. As illustrated in FIG. 21, the rotation guide module 700 may be in a rail shape, but is not limited thereto. The rotation guide module 700 is not limited in shape and position in so far as the rotation guide module 700 can rotate the detecting module 304 and can guide the rotation of the detecting module 304.

The rotation guide module 700 can rotate the laser module 404 around the chuck 101. The rotation guide module 700 may rotate the laser module 404 along the outer circumference of the wafer supporting system 200. As illustrated in FIG. 21, the rotation guide module 700 may be in a rail shape, but is not limited thereto. The rotation guide module 700 is not limited in shape and position in so far as the rotation guide module 700 can rotate the laser module 404 and can guide the rotation of the laser module 404.

The laser module 404 and the detecting module 304 may be spaced apart from each other on the rotation guide module 700. The laser module 404 and the detecting module 304 may move at the same speed and in the same direction on the rotation guide module 700, but are not limited thereto.

Hereinafter, referring to FIG. 23, an initiator for debonding a wafer supporting system according to a ninth embodiment of the inventive concept will be described. This embodiment is the same as the eighth embodiment as described above except that a detecting module and a laser module are attached to be fixed to each other. Accordingly, the duplicate explanation thereof will be simplified or omitted.

Figure 23:
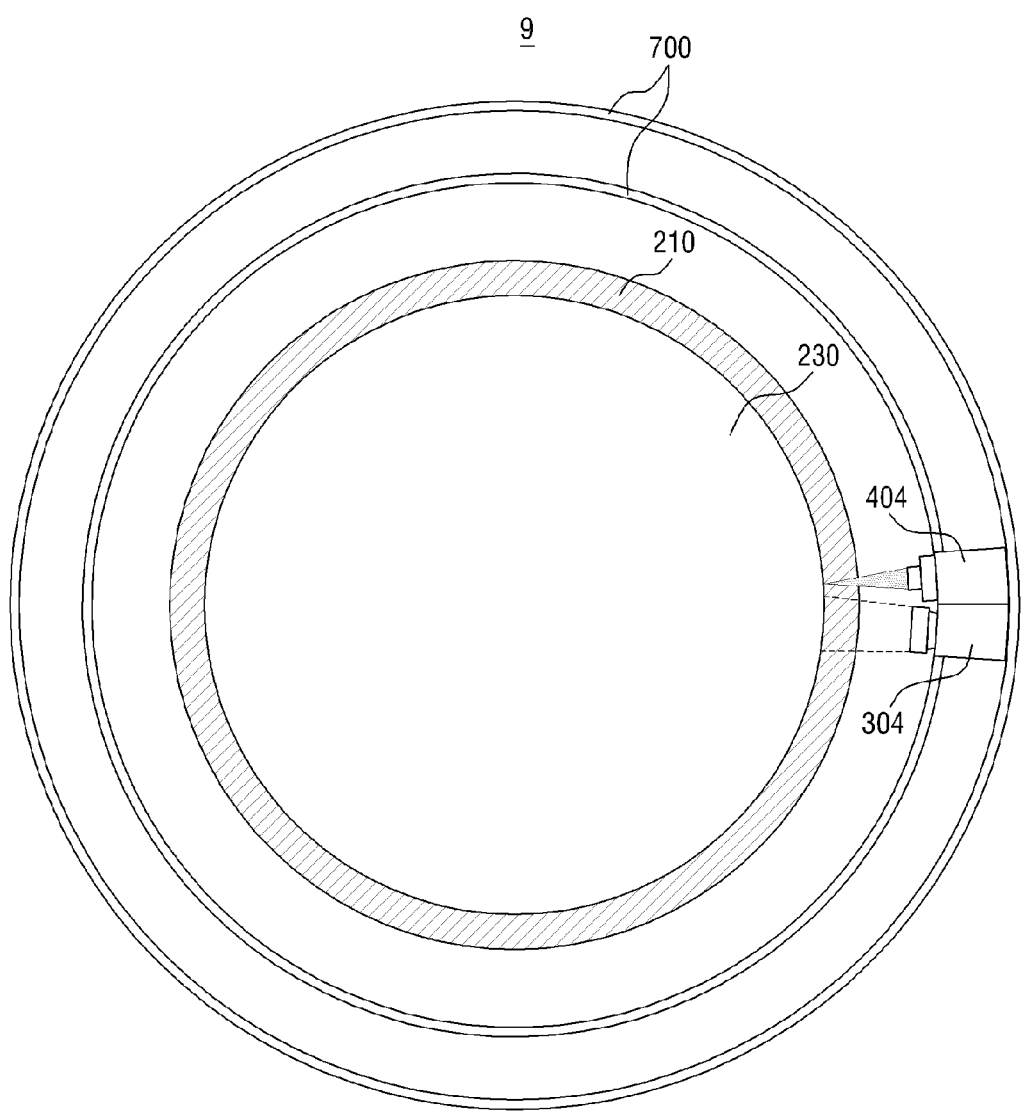

FIG. 23 is a plan view explaining an initiator for debonding a wafer supporting system according to a ninth embodiment of the inventive concept.

Referring to FIG. 23, an initiator 9 for debonding a wafer supporting system according to a ninth embodiment of the inventive concept includes a detecting module 304 and a laser module 404 that are attached to be fixed to each other.

The detecting module 304 and the laser module 404 may be attached to be fixed to each other. The detecting module 304 and the laser module 404 may be rotated on the side surface of the wafer supporting system 200. The detecting module 304 and the laser module 404 may be rotated together along the outer circumference of the wafer supporting system 200. That is, the detecting module 304 and the laser module 404 may detect the height and the thickness of the glue layer 220 of the wafer supporting system 200 and may irradiate the glue layer 220 with a laser as it is being rotated around the wafer supporting system 200. The detecting module 304 and the laser module 404 may be rotated along the rotation guide module 700.

Through this, according to the initiator 9 for debonding the wafer supporting system according to the ninth embodiment of the inventive concept, the height and the vertical position in which the detecting module 304 measures the height and the thickness of the glue layer 220 may be equal to or similar to the height and the vertical position in which the laser module 404 radiates a laser. Accordingly, the position adjustment of the laser module 404 may be performed more easily and precisely in comparison to the case where the detecting module 304 and the laser module 404 are separated from each other. Further, since information measured in the detecting module 304 is used in the adjacent laser module 404, the transmission path is shortened to heighten the reliability and efficiency.

Hereinafter, referring to FIGS. 1, 4, and 24 to 29, a method for debonding a wafer supporting system according to an embodiment of the inventive concept will be described.

Figure 24:
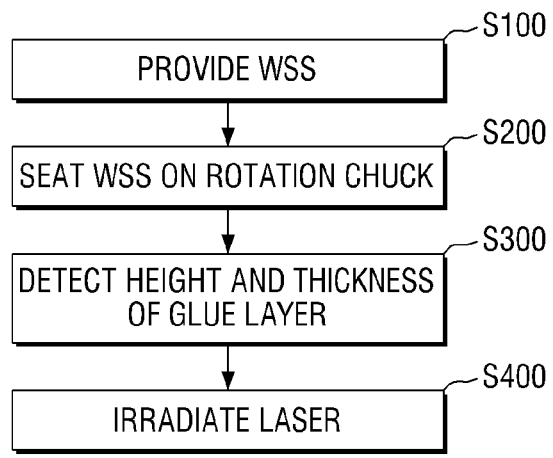

FIG. 24 is a flowchart explaining a method for debonding a wafer supporting system according to an embodiment of the inventive concept.

Referring to FIG. 24, a wafer supporting system is provided (S100).

Specifically, referring to FIG. 4, the wafer supporting system 200 includes the carrier wafer 210, the device wafer 230, and the glue layer 220.

The carrier wafer 210 may be a dummy wafer that is bonded to heighten durability of the device wafer 230. The carrier wafer 210 may prevent the device wafer 230 from being damaged while the device wafer 230 forms a through silicon via (TSV).

The radius d2 of the carrier wafer 210 may be larger than or equal to the radius d1 of the device wafer 230, but is not limited thereto. However, in the case where the radius d2 of the carrier wafer 210 is larger than or equal to the radius d1 of the device wafer 230, durability of an edge portion of the device wafer 230 can be strengthened. The carrier wafer 210 may be in a circular plate shape.

The device wafer 230 may be a wafer on which an actual pattern is formed to be actually used as a semiconductor device. The device wafer 230 may be a wafer in a circular plate shape, which has first and second surfaces. Actual circuit patterns and bumps may be formed on the first surface. The first surface may be a surface on which the glue layer 220 is formed. That is, the first surface may be a surface to which the device wafer 230 and the carrier wafer 210 are bonded through the glue layer 220.

The glue layer 220 may be positioned between the carrier wafer 210 and the device wafer 230. The glue layer 220 may be spread as a viscous semi-liquid, and then may be cured to bond the carrier wafer 210 and the device wafer 230 to each other. In general, the glue layer 220 is evenly spread, but may not be evenly spread due to several causes.

The thickness d3 of the carrier wafer 210 may be larger than or equal to the thickness d4 of the glue layer 220. The thickness d5 of the device wafer 230 may be thinner than or equal to the thickness d3 of the carrier wafer 210 and the thickness d4 of the glue layer 220. That is, the device wafer 230 may be thinnest.

The through silicon via 232 may be formed on the device wafer 230. The forming of the through silicon via 232 may cause big mechanical stress on the thin device wafer 230. Accordingly, the carrier wafer 210 having large volume may be bonded to the device wafer 230 through the glue layer 220 to prevent the damage of the device wafer 230 while the through silicon via 232 is formed.

That is, the carrier wafer 210 may be separated from the device wafer 230 after the through silicon via 232 is formed. According to the first embodiment of the inventive concept, the initiator 1 for debonding a wafer supporting system is a device to start such a separation process.

Referring again to FIG. 24, the wafer supporting system is seated on the rotation chuck (S200).

Specifically, referring to FIG. 1, the wafer supporting system 200 may be seated on the upper surface of the rotation chuck 100. The rotation chuck 100 may have a horizontal cross-section that is smaller than the horizontal cross-section of the wafer supporting system 200 that is seated on the upper surface of the rotation chuck 100. Accordingly, the upper surface of the rotation chuck 100 may be entirely covered by the wafer supporting system 200, but is not limited thereto.

The rotation chuck 100 may rotate about a rotating center. The rotation chuck 100 may rotate the wafer supporting system 200 that is seated on the upper surface thereof. If the wafer supporting system 200 is circular, the rotating center of the rotation chuck 100 may vertically overlap the center of the circle of the wafer supporting system 200. That is, the wafer supporting system 200 may be aligned so that the rotating center of the rotation chuck 100 and the center of the wafer supporting system 200 coincide with each other.

Referring again to FIG. 24, the height and the thickness of the glue layer are detected (S300).

Specifically, referring to FIG. 1, the detecting module 300 may inspect the side surface of the wafer supporting system 200. Specifically, the detecting module 300 may inspect the glue layer 220 of the wafer supporting system 200. The glue layer 220 may be positioned between the carrier wafer 210 and the device wafer 230 of the wafer supporting system 200. The detecting module 300 may detect the height and the thickness of the glue layer 220.

The height and the thickness of the glue layer 220 may be exposed along the circumference of the wafer supporting system 200. The height and the thickness of the glue layer 220 may not be constant depending on the circumference of the wafer supporting system 200. Accordingly, if the wafer supporting system 200 is rotated by the rotation chuck 100, the detecting module 300 can measure the height and the thickness of the glue layer 220 along the circumference of the wafer supporting system 200.

Referring again to FIG. 24, a laser is irradiated onto the glue layer (S400).

Specifically, referring to FIG. 1, the laser module 400 may irradiate the glue layer 220 with a laser. The laser module 400 may form a fracture portion on the side surface of the glue layer 220 by irradiating the glue layer 220 with the laser. The laser module 400 may form the fracture portion on the side surface of the glue layer 220 using the height and the thickness of the glue layer 220 detected by the detecting module 300. The laser module 400 may irradiate only the glue layer 220 with the laser without damaging the carrier wafer 210 or the device wafer 230 using the height and the thickness of the glue layer 220.

Figure 25:
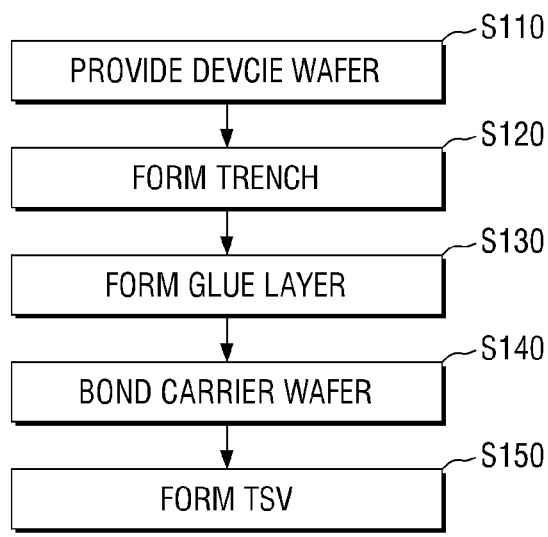

FIG. 25 is a flowchart explaining in detail a step of providing a wafer supporting system of FIG. 24, and FIGS. 26 to 29 are views of intermediate steps explaining a method for debonding a wafer supporting system.

Referring to FIG. 25, a step (S100) of providing a wafer supporting system includes a plurality of steps.

First, a device wafer is provided (S110).

Figure 26:
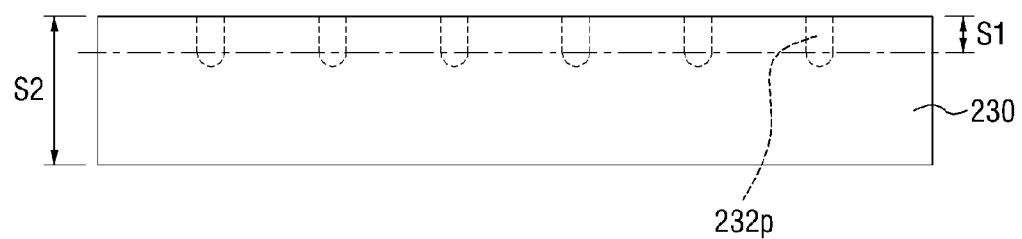

Specifically, referring to FIG. 26, the device wafer 230 is a wafer on which an actual pattern is formed to be actually used as a semiconductor device. The device wafer 230 may be a wafer in a circular plate shape, which has first and second surfaces. Actual circuit patterns and bumps may be formed on the first surface (i.e., upper surface in FIG. 26).

A lower portion of the device wafer 230, which includes the second surface, may be removed. Accordingly, in consideration of the removed portion, the device wafer 230 may have a sufficient thickness s2.

Referring again to FIG. 25, a trench is formed (S120).

Referring again in FIG. 26, the trench 232p may be formed on the upper surface, that is, the first surface, of the device wafer 230. A plurality of trenches 232p may be provided. Since the trench 232p becomes a through silicon electrode later, it may be formed in a position where the through silicon electrode is required.

The trench 232p may have a depth that is equal to or larger than a first depth s1 on the upper surface of the device wafer 230. The first depth s1 may correspond to a point where the device wafer 230 remains with a lower portion thereof removed later.

Referring again to FIG. 25, a glue layer is formed (S120).

Figure 27:
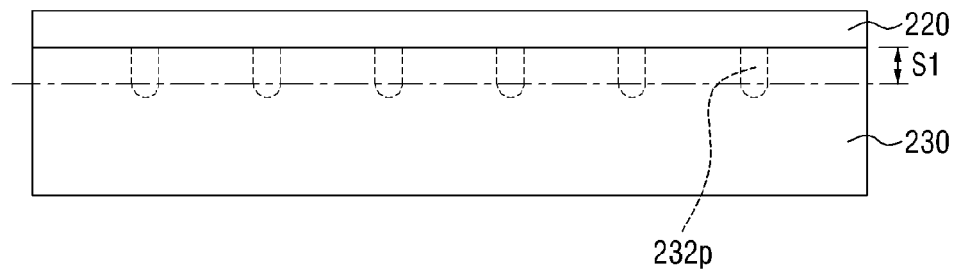

Specifically, referring to FIG. 27, the glue layer 220 may be spread as a viscous semi-liquid, and then may be cured to bond the carrier wafer 210 and the device wafer 230 to each other. In general, the glue layer 220 may be evenly spread, but may not be evenly spread due to several causes.

Before the carrier wafer 210 is bonded, the glue layer 220 of FIG. 27 may be in a viscous semi-liquid state in which the glue layer 220 is not completely cured. Since the viscous semi-liquid is cured with the lapse of time, the carrier wafer 210 should be bonded as soon as possible before the lapse of time.

The glue layer 220 may be a portion that is removed later through cleaning. That is, the glue layer 220 is a portion that is temporarily used to bond the carrier wafer 210, and thus may be completely removed later.

Referring again to FIG. 25, the carrier wafer is bonded (S130).

Figure 28:
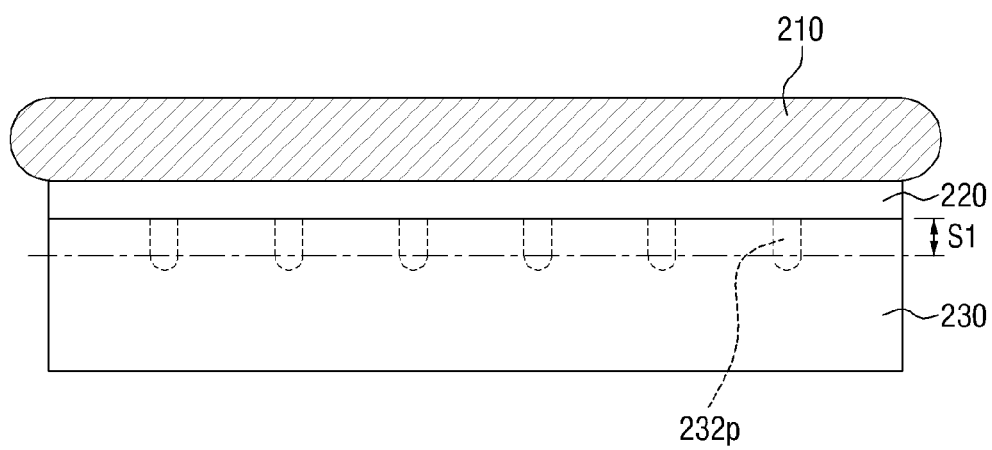

Specifically, referring to FIG. 28, the carrier wafer may be attached to the upper surface of the glue layer 220.

The carrier wafer 210 may be a dummy wafer that is bonded to heighten durability of the device wafer 230. The carrier wafer 210 may prevent the device wafer 230 from being damaged while the device wafer 230 forms the through silicon via (TSV).

The radius of the carrier wafer 210 may be larger than the radius of the device wafer 230, but is not limited thereto. However, in the case where the radius of the carrier wafer is larger than the radius of the device wafer 230, durability of an edge portion of the device wafer 230 can be strengthened. The carrier wafer 210 may be in a circular plate shape.

Referring again to FIG. 25, the through silicon via is formed (S130).

Figure 29:
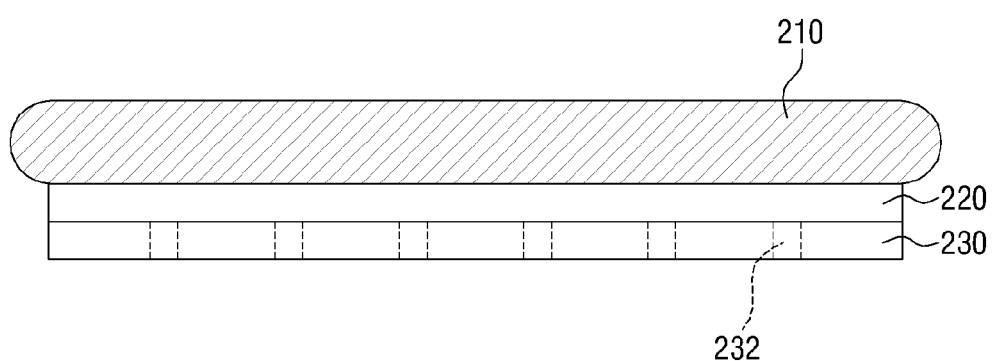

Specifically, referring to FIG. 29, the device wafer 230 may remove the lower portion that includes the second surface (lower surface in FIG. 28). Accordingly, the trench 232p may be formed as the through silicon via 232 that penetrates the device wafer 230.

In the process of removing the lower portion of the device wafer 230, if the carrier wafer 210 is not bonded thereto, a crack may occur in the device wafer 230. Such a crack may damage devices of the device wafer 230. As a result, a semiconductor device having low reliability may be manufactured.

Accordingly, by bonding the carrier wafer 210 to the device wafer 230 in advance, the device wafer 230 can be prevented from being damaged in the process of forming the through silicon via 232.

Hereinafter, referring to FIG. 30, a method for debonding a wafer supporting system according to another embodiment of the inventive concept will be described. This embodiment is the same as the above described embodiment except that this embodiment further includes separating a carrier wafer and a device wafer from each other. Accordingly, the duplicate explanation as described above will be simplified or omitted.

Figure 30:
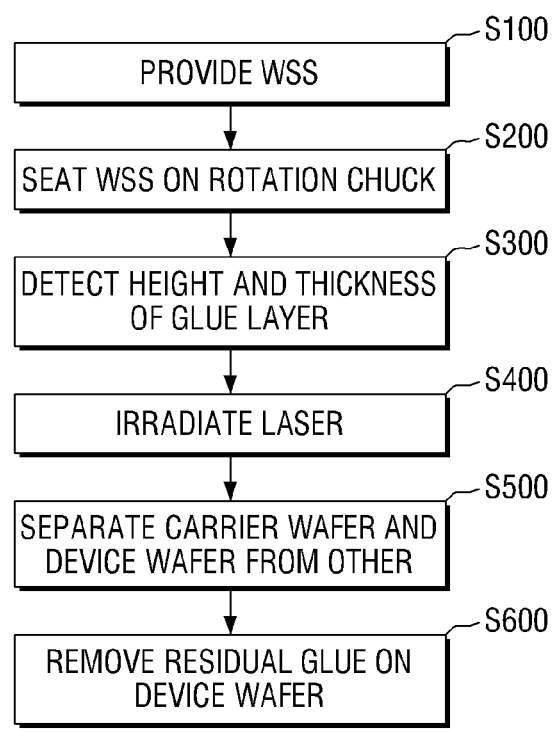

FIG. 30 is a flowchart explaining a method for debonding a wafer supporting system according to another embodiment of the inventive concept.

Referring to FIG. 30, after the glue layer is irradiated with a laser, the carrier wafer and the device wafer are separated from each other (S500).

The separating debonding process may be performed by a fracture portion that is irradiated with the laser. That is, the fracture portion may be a peel-off start point. Forces in opposite directions may be applied to the device wafer 230 and the carrier wafer 210 on the basis of the fracture portion to separate the device wafer 230 and the carrier wafer 210 from each other.

The carrier wafer 210 is a dummy wafer to heighten durability in the process of forming the through silicon via 232 in the device wafer 230. Accordingly, after the through silicon via 232 is formed, the carrier wafer 210 may be separated to be removed.

Then, a residual glue layer of the device wafer is removed (S600).

Once the device wafer 230 and the carrier wafer 210 are separated from each other, the glue layer 220 may be peeled off. In this case, the glue layer 220 may remain on the device wafer 230 and the carrier wafer 210.

The residual glue layer that remains on the device wafer 230 may be removed. This may be performed by a wet process for removing the glue layer 220.

If the carrier wafer 210 is removed in the above-described process, the semiconductor device can be manufactured using the device wafer 230.

Although preferred embodiments of the inventive concept have been described for illustrative purposes, those skilled in the art will appreciate that various modifications, additions and substitutions are possible, without departing from the scope and spirit of the invention as disclosed in the accompanying claims.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. An initiator for debonding a wafer supporting system, comprising:

a rotation chuck having an upper surface on which a wafer supporting system (WSS) is seated and configured to rotate the wafer supporting system, the wafer supporting system includes a carrier wafer, a device wafer, and a glue layer bonding the carrier wafer and the device wafer;
a detecting module configured to detect a height and a thickness of the glue layer; and
a laser module configured to generate a fracture portion on the glue layer through irradiating a side surface of the glue layer with laser on the basis of the height and the thickness of the glue layer,
wherein the detecting module comprises an image sensor configured to capture an image of the wafer supporting system,
wherein the detecting module comprises a first position control module configured to adjust a height and a horizontal position of the detecting module.

2. The initiator of claim 1, wherein a thickness of the carrier wafer is equal to or larger than a thickness of the device wafer.

3. The initiator of claim 1, wherein the carrier wafer and the device wafer are in a circular shape, and
a diameter of the carrier wafer is equal to or larger than a diameter of the device wafer.

4. The initiator of claim 3, wherein in the wafer supporting system, the glue layer is formed on an upper surface of the carrier wafer, and
the device wafer is bonded onto the glue layer.

5. The initiator of claim 3, wherein a center of the carrier wafer and a center of the device wafer vertically overlap each other.

6. The initiator of claim 3, wherein a center of the wafer supporting system and a rotating center of the rotation chuck are aligned to vertically overlap each other.

7. The initiator of claim 6, further comprising a loading arm configured to seat the wafer supporting system on the rotation chuck,
wherein the detecting module is configured to detect whether the center of the wafer supporting system and the rotating center of the rotation chuck are aligned to vertically overlap each other, and
if the center of the wafer supporting system and the rotating center of the rotation chuck do not overlap each other, the loading arm is configured to readjust a seating position of the wafer supporting system.

8. The initiator of claim 1, wherein the detecting module is positioned on a side surface of the wafer supporting system, and is configured to detect the height and the thickness of the side surface of the glue layer while the wafer supporting system is rotated.

9. The initiator of claim 1, wherein the detecting module and the laser module are bonded to be fixed to each other.

10. The initiator of claim 1, further comprising a presser applying a force onto the wafer supporting system to prevent the glue layer from bursting open.

11. The initiator of claim 1,
wherein the detecting module is spaced apart from the wafer supporting system.

12. The initiator of claim 1, wherein the glue layer comprises a first glue layer formed on an upper surface of the carrier wafer and a second glue layer formed on a side surface of the carrier wafer, and
the laser module is configured to remove the second glue layer.

13. The initiator of claim 1, wherein the device wafer comprises at least a through silicon via (TSV).

14. The initiator of claim 1, wherein the fracture portion has a depth of 1 mm to 10 mm in a center direction from the side surface of the glue layer.

15. The initiator of claim 1, wherein the fracture portion is formed on the side surface of the glue layer.

16. An initiator for debonding a wafer supporting system, comprising:
a rotation chuck having an upper surface on which a wafer supporting system (WSS) is seated and configured to rotate the wafer supporting system, the wafer supporting system includes a carrier wafer, a device wafer, and a glue layer bonding the carrier wafer and the device wafer;
a detecting module configured to detect a height and a thickness of the glue layer; and
a laser module configured to generate a fracture portion on the glue layer through irradiating a side surface of the glue layer with laser on the basis of the height and the thickness of the glue layer,
wherein the detecting module comprises an image sensor configured to capture an image of the wafer supporting system,
wherein the laser module is spaced apart from the wafer supporting system, and
wherein the laser module comprises a second position control module configured to adjust a height and a horizontal position of the laser module.

17. The initiator of claim 16, wherein the second position control module is configured to adjust the height of the laser module according to the height and the thickness of the glue layer.

18. An initiator for debonding a wafer supporting system including a device wafer having a through silicon electrode, a glue layer formed on one surface of the device wafer, and a carrier wafer bonded to the glue layer, comprising:
a chuck having an upper surface on which the wafer supporting system is seated;
a detecting module configured to sense a height and a thickness of the glue layer on a side surface of the wafer supporting system as the wafer supporting system rotates; and
a laser module configured to form a fracture portion through irradiating a side surface of the glue layer with laser as the wafer supporting system rotates on the basis of the height and the thickness of the glue layer,
wherein the laser module comprises a position control module configured to adjust a height and a horizontal position of the laser module.

19. The initiator of claim 18, wherein the detecting module and the laser module are bonded to each other to be rotated simultaneously.

* * * * *